United States Patent [19]
Ohta et al.

[11] Patent Number: 5,656,956
[45] Date of Patent: Aug. 12, 1997

[54] LOGIC GATE CIRCUIT AND DIGITAL INTEGRATED CIRCUIT

[75] Inventors: Akira Ohta; Norio Higashisaka, both of Tokyo, Japan

[73] Assignee: Mitsubishi Denki Kabushiki Kaisha, Tokyo, Japan

[21] Appl. No.: 590,526

[22] Filed: Jan. 24, 1996

[30] Foreign Application Priority Data

Mar. 28, 1995 [JP] Japan ................................ 7-069273

[51] Int. Cl.$^6$ ................................ H03K 19/094
[52] U.S. Cl. ........................ 326/120; 326/112; 326/119
[58] Field of Search ........................ 326/112, 119, 326/120

[56] References Cited

U.S. PATENT DOCUMENTS

| | | | |
|---|---|---|---|
| 4,521,698 | 6/1985 | Taylor | 326/120 |
| 4,578,694 | 3/1986 | Ariizumi et al. | 326/120 |
| 4,709,168 | 11/1987 | Kamuro | 326/120 |
| 5,291,077 | 3/1994 | Hirakata | 326/112 |
| 5,374,862 | 12/1994 | Takano | 326/112 |

FOREIGN PATENT DOCUMENTS

| | | |
|---|---|---|
| 62-206921 | 9/1987 | Japan . |
| 2280413 | 11/1990 | Japan . |

*Primary Examiner*—Edward P. Westin
*Assistant Examiner*—Benjamin D. Driscoll
*Attorney, Agent, or Firm*—Leydig, Voit & Mayer

[57] ABSTRACT

A logic gate circuit includes a resistor, a current limiting circuit, a switching transistor, and a load transistor, the source of load transistor being connected to the drain of the switching transistor, the gate of the switching transistor being connected to an input terminal, the resistor being connected between the source of and the gate of the load transistor, and the current limiting circuit being connected between the gate of the load transistor and the source of the switching transistor. By using this logic gate circuit in the low speed operating section of an LSI, the dissipation current and the chip area of the LSI can be reduced even when the gate width and the threshold voltage of the load FET are the same as those in the high speed operating section.

24 Claims, 15 Drawing Sheets

LSI

LOGIC GATE CIRCUIT AND DIGITAL INTEGRATED CIRCUIT

FIELD OF THE INVENTION

The present invention relates to a logic gate circuit and a digital integrated circuit, and more particularly, to a logic gate circuit and a digital integrated circuit which utilize a field effect transistor (FET).

BACKGROUND OF THE INVENTION

A logic gate circuit such as a DCFL (Direct Coupled FET Logic) circuit or a BFL (Buffered FET Logic) circuit, in which a drain of a load FET is connected to a high voltage power source ($V_{DD}$), is available as a logic gate circuit such as an inverter or a NOR gate utilizing a junction FET or a MESFET.

A DCFL inverter circuit is shown in FIG. 24. In the figure, reference numeral 1 designates a switching FET, reference numeral 2 designates a load FET, reference numeral 5 designates an input terminal for a data signal, reference numeral 6 designates an output terminal for a data signal, reference numeral 7 designates a low voltage power source terminal, reference numeral 8 designates a high voltage power source terminal, and reference numeral 70 designates a switching FET of a next stage connected to the output terminal. The voltage of the high voltage power source and the voltage of the low voltage power source are designated as $V_{DD}$ and $V_{SS}$, respectively. The switching FET1 is an enhancement type FET in which there is no current flowing between the drain and the source when the gate-source voltage is zero, and the load FET2 is a depletion type FET in which there is current flowing between the drain and the source even when the gate-source voltage is zero. The drain of the switching FET1 is connected to the source of the load FET2, which also serves as the output terminal. The gate of the load FET2 is connected to the source of the load FET2. Both FETs have n type channels.

The operation of this DCFL inverter circuit will be described with reference to the operation curve illustrated in FIG. 25. In the figure, the abscissa represents the voltage of the output terminal 6 and the ordinate represents the current flowing through the switching FET1, the load FET2, or the output terminal 6. For the low level signal voltage $V_L$ and the high level signal voltage $V_H$ in a digital circuit utilizing DCFL, the following relationship stands: $V_{SS} < V_L \leq V_{th1} < V_H \leq V_{DD}$, where $V_{th1}$ designates the threshold voltage of the switching FET1, and if the voltage between the gate and the source is designated as $V_{gs}$, then the current between the drain and the source does not flow when $V_{gs} \leq V_{th1}$, but does flow when $V_{gs} > V_{th1}$. When the signal voltage at the input terminal 5 is high, the gate voltage of the switching FET1 becomes $V_H$ and it takes the on-state, that is, a state in which the current flows between the drain and the source in the FET1. The current-voltage characteristic between the drain and the source of the switching FET1 then becomes 80 in the figure. In the load FET2, since the voltage between the gate and the source is fixed as described above, its current-voltage characteristic between the drain and the source always remains 82 in the figure independently of the voltage at the input terminal. That is, the load FET2 serves as a source of constant current which maintains the current $I_L$. Therefore, the operating point in this case becomes a point A which is the intersection of the curves 80 and 82 and the signal voltage at the output terminal 6 becomes $V_L$, that is, the low signal voltage. When the signal voltage at the input terminal 6 is low, the gate voltage of the switching FET1 becomes $V_L$ and it takes the off-state, that is, a state in which no current flows between the drain and the source in the FET1. The current-voltage characteristic between the drain and the source of the switching FET1 then becomes 81 in the figure. Since the output terminal 6 is connected to the gate of the switching FET70 of the next stage and the current-voltage characteristic between the gate and the source of a junction FET or a MESFET presents a diode characteristic, when the voltage at the input terminal 6 increases beyond the rise voltage $V_F$ in the forward direction of this diode, a forward direction current shown by a curve 83 in the figure starts to flow through the output terminal 6. Since $V_{DD}$ is usually set such that $V_{DD} > V_F$, the operating point in this case becomes a point B which is the intersection of the curves 82 and 83, and the signal voltage at the output terminal 6 becomes $V_H$, that is, a high voltage. In either case, the dissipation current of the inverter circuit remains constant, showing a value $I_L$.

When the signal voltage at the input terminal switches from high to low, the characteristic of the switching FET1 changes from 80 to 81 in FIG. 25. Therefore, the current $I_L$ of the load FET2 flows into the gate of the switching FET70 of the next stage through a wiring and until the voltage of the gate becomes high, that is, $V_H$, the current continues to charge the capacitance between gate and source $C_{gs}$ of the next stage FET and the wiring capacitance $C_L$. On the other hand, when the signal voltage at the input terminal switches from low to high, the characteristic of the switching FET1 changes from 81 to 80 in the FIG. 25. Therefore, the capacitance between gate and source $C_{gs}$ of the next stage FET and the wiring capacitance $C_L$ are discharged by the current corresponding to the difference between the current $I_L$ and the current represented by the curve 80 flowing from the gate of the next stage FET70 to the low voltage power source terminal 7 through the wiring and the switching FET1, and the gate voltage of the FET70, that is, the voltage at the output terminal 6 becomes low, that is, $V_L$. The shorter the time required to charge/discharge the capacitance $C_{gs}$ of the next stage switching FET and the wiring capacitance $C_L$ becomes, the faster the operating speed of the logic gate circuit becomes (the shorter the delay time becomes). Therefore, if the capacitance $C_{gs} + C_L$ which is connected to the output terminal is held constant, the larger the dissipation current $I_L$ becomes, the faster the operation speed of the logic gate circuit becomes. In this case, it is also necessary to set the current of the switching FET in the on-state to appropriate value with respect to $I_L$.

If the gate length is held constant, the $I_L$ is determined by the gate width and the threshold voltage of the load FET. Since, in the fabrication of digital integrated circuits, the channels of load FETs are usually formed by ion implantation or the like, the threshold voltage cannot be varied for each FET but can only be set for several values for a wafer at the most. Therefore, the adjustment of the dissipation current for each logic gate circuit is achieved by adjusting the gate widths of the FET. However, there exists a minimum width $W_{gmin}$ for the gate width which is dependent on a production process and an FET having a gate width which is less than the minimum width $W_{gmin}$ cannot be fabricated.

Therefore, in designing a digital LSI, the gate width of an FET of a logic gate circuit whose required current is the least can be chosen to be the $W_{gmin}$, and the threshold voltage of the load FET can be set so that the current required in this logic gate circuit is obtained.

However, in a digital LSI utilizing the prior art DCFL gate circuit described above, when the number of logic gate circuits whose required current is low is small and the majority of logic gate circuits of the LSI requires larger current, if only one threshold voltage is chosen for the load FETs, it becomes necessary to design the gate width of the FET to be bigger than $W_{gmin}$ and the logic gate circuit has a large dissipation current and the chip size of the LSI increases. For example, in the LSI illustrated in FIG. 26 having a high speed operating section (high power dissipation section) 91 and a low speed operating section (low power dissipation section) 92, since the required optimum current for each section is different, if the threshold voltage is set for a load FET in the low speed operating section 92, the gate width of an FET in the high speed operating section 91 increases, resulting in an increase in the chip size of the LSI. On the other hand, if the gate width of a load FET in the high speed operating section 91 is chosen to be $W_{gmin}$ and the threshold voltage is set for this load FET, the dissipation current (power dissipation) of the low speed operating section (low power dissipation section) 92 increases.

SUMMARY OF THE INVENTION

It is an object of the present invention to provide a logic gate circuit which can reduce the power dissipation, as well as the chip area, of a digital LSI.

It is another object of the present invention to provide a digital LSI which makes use of this logic gate circuit.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a logic gate circuit comprises an input terminal and an output terminal; a first resistor having two ends; a current limiting circuit having two ends; a switching FET having a drain, a source, and a gate; a load FET which is a depletion type FET having a source and a gate; the source of the load FET being connected to the drain of the switching FET; the gate of the switching FET being connected to the input terminal; the drain of the switching FET being connected to the output terminal; one end of the first resistor being connected to the source of the load FET and the other end of the first resistor being connected to the gate of the load FET; and one end of the current limiting circuit being connected to the gate of the load FET and the other end of the current limiting circuit being connected to the source of the switching FET. Therefore, the gate voltage of the load FET can be made closer to the source voltage of the switching FET than to the source voltage of the load FET, and the current flowing between the drain and the source of the load FET, that is the dissipation current of the logic gate circuit, can be made smaller than that of the prior art DCFL gate circuit previously described. Therefore, when a gate width of a load FET in a DCFL gate circuit in a high speed operation section of a digital LSI is chosen to be the minimum gate width $W_{gmin}$ which is determined by fabrication processes and its threshold voltage is determined in accordance with this minimum gate width, by using the above logic gate circuit according to the present invention in the low speed operating section, the dissipation current can be reduced even though the gate width and the threshold voltage of the load FET are the same as those in the high speed operating section, and since the gate width of the load FET in the high speed operating section is $W_{gmin}$, the chip area of the LSI can be reduced.

According to a second aspect of the present invention, in the logic gate circuit described in the first aspect of the present invention, the current limiting circuit comprises a second resistor having two ends, one end of the second resistor being the one end of the current limiting circuit and the other end of the second resistor being the other end of the current limiting circuit. Therefore, the gate voltage of the load FET can be made to be the voltage which is determined by dividing a voltage difference between the source voltage of the load FET and the source voltage of the switching FET by the first and the second resistors. Since the voltage determined by this division is closer to the source voltage of the switching FET than to the source voltage of the load FET, the dissipation current of the logic gate circuit can be made smaller than that of the prior art DCFL gate circuit previously described. Therefore, when the gate width of the load FET in the DCFL gate circuit in the high speed operating section of a digital LSI is chosen to be the minimum gate width $W_{gmin}$ and its threshold voltage is determined in accordance with this minimum gate width, by using the above logic gate circuit according to the present invention in the low speed operating section, the dissipation current can be reduced even though the gate width and the threshold voltage of the load FET are the same as those in the high speed operating section, and since the gate width of the load FET in the high speed operating section is $W_{gmin}$, the chip area of the LSI can be reduced. That is, the power dissipation, as well as the chip area, of the LSI can be reduced.

According to a third aspect of the present invention, in the logic gate circuit described in the first aspect of the present invention, the current limiting circuit comprises a current control element comprising a current control signal input terminal, a second resistor having two ends, one end of the second resistor being the one end of the current limiting circuit, and a current control FET having a source, a drain, and a gate, the source being the other end of the current limiting circuit, the drain being connected to the other end of the second resistor, and the gate being connected to the current control signal input terminal. Therefore, when the signal voltage at the current control signal input terminal is high, the current control FET takes the on-state, and if the voltage $V_{DS}$ between the drain and the source of the current control FET in this case is made sufficiently smaller than the voltage drop due to the first and the second resistors, the gate voltage of the load FET can be made to be the voltage determined by dividing the voltage difference between the source voltage of the load FET and the source voltage of the switching FET by the first and the second resistors, and the dissipation current of the logic gate circuit can be made smaller than that of the prior art DCFL gate circuit previously described. When the signal voltage at the current control signal input terminal is low, the current control FET takes the off-state and the gate voltage of the load FET becomes the same as its source voltage due to the first resistor. Consequently, the dissipation current of the logic gate circuit becomes larger than in the case in which the current control FET is in the on-state, and the operating speed of the logic gate circuit can be made faster. Therefore, the dissipation current can be increased by making the current control FET to be in the off-state only when the high speed operation of the logic gate circuit is required, and, in other cases, the dissipation current can be reduced by making the current control FET to be in the on-state. The power dissipation of the LSI can be reduced by using this logic gate circuit.

According to a fourth aspect of the present invention, in the logic gate circuit described in the first aspect of the present invention, the current limiting circuit comprises a plurality of current control elements connected in parallel, each current control element comprising a current control signal input terminal, a second resistor having two ends, one end of the second resistor being connected to the one end of the current limiting circuit, and a current control FET having a source, a drain, and a gate, the source being connected to the other end of the current limiting circuit, the drain being connected to the other end of the second resistor, and the gate being the current control signal input terminal. Therefore, by choosing the signal voltages at each current control signal input terminal to be high or low, only specified current control FETs can be made to be in the on-state and other current control FET to be in the off-state. If the voltage $V_{DS}$ of the current control FETs in the on-state is made sufficiently smaller than the voltage drop due to the first and the second resistor, the gate voltage of the load FET can be made to be the voltage determined by dividing the voltage difference between the source voltage of the load FET and the source voltage of the switching FET by the composite resistor for the parallel connection of the second resistors connected to the current control FETs in the on-state and the first resistor. Therefore, by changing the combination of the current control FETs to be in the on-state, the gate voltage of the load FET can be changed and the dissipation current can be adjusted, thereby easily optimizing the dissipation current of each logic gate circuit. Furthermore, by using this logic gate circuit, the power dissipation of the LSI can be reduced.

According to a fifth aspect of the present invention, in the logic gate circuit described in the third aspect or the fourth aspect of the present invention, each current control element comprises a plurality of current control signal input terminals, a second resistor having two ends, one end of the second resistor being connected to the one end of the current limiting circuit, and the same number of current control FETs connected in parallel as the current control signal input terminals, each current control FET having a gate, a drain, and a source, the drain being connected to the other end of the second resistor, the gate being one of the current control signal input terminal, and the source being connected to the other end of the current limiting circuit. Therefore, only when all these current control FETs take the off-state, the gate and the source of the load FET become at the same voltage. When at least one of the current control FETs takes the on-state, the gate voltage of the load FET becomes the voltage determined by dividing the voltage difference between the source voltage of the load FET and the source voltage of the switching FET by the first and the second resistors. That is, the logic gate circuit described in the third or the fourth aspect of the present invention to which the OR function toward multiple current control signals has been added can be obtained.

According to an sixth aspect of the present invention, in the logic gate circuit described in the third aspect or the fourth aspect of the present invention, each current control element comprises a plurality of current control signal input terminals, a second resistor having two ends, one end of the second resistor being connected to the one end of the current limiting circuit, and the same number of current control FETs connected in series as the current control signal input terminals, each current control FET having a gate, a drain, and a source, the source of one of the current control FETs at one end of the series being connected to the other end of the current limiting circuit, the drain of another one of the current control FETs at the other end of the series being connected to the other end of the second resistor, and the gate being one of the current control signal input terminals. Therefore, only when all these current control FETs take the on-state, the gate voltage of the load FET becomes the voltage determined by dividing the voltage difference between the source voltage of the load FET and the source voltage of the switching FET by the first and the second resistor. When at least one of the current control FETs takes the off-state, the gate and the source of the load FET become at the same voltage. That is, the logic gate circuit described in the third or the fourth aspect of the present invention to which the AND function toward multiple current control signals has been added can be obtained.

According to a seventh aspect of the present invention, in the logic gate circuit described in the first aspect of the present invention, the current limiting circuit comprises a current control signal input terminal and a current control FET having a drain, a source, and a gate, the drain being one end of the current limiting circuit, the source being the other end of the current limiting circuit, and the gate being the current control signal input terminal. Therefore, when the current control FET is in the on-state, if the drain-source voltage $V_{DS}$ of the current control FET is made sufficiently small, the gate of the load FET and the source of the switching FET can be made at the same voltage, and the dissipation current of the logic gate circuit can be made smaller than that of the prior art DCFL gate circuit previously described. When the current control FET is in the off-state, the gate and the source of the load FET become at the same voltage due to the first resistor, and the dissipation current in the logic gate circuit becomes larger than in the case in which the current control FET is in the on-state, thereby increasing the operating speed of the logic gate circuit. Therefore, the dissipation current can be increased by making the current control FET to be in the off-state only when the high speed operation of the logic gate circuit is required. In other cases, the dissipation current can be reduced by making the current control FET to be in the on-state. Furthermore, since this logic gate circuit has the arrangement of the logic gate circuit described in the third aspect of the present invention from which the second resistor has been removed, the chip area of the LSI can be reduced by that amount.

According to a eighth aspect of the present invention, in the logic gate circuit described in the first aspect of the present invention, the current limiting circuit comprises a plurality of current control signal input terminals and the same number of current control FETs connected in parallel as the current control signal input terminals, each current control FET having a drain, a source, and a gate, the drain being connected to one end of the current limiting circuit, the source being connected to the other end of the current limiting circuit, and the gate being one of the current control signal input terminals. Therefore, only when all these current control FETs take the off-state, the gate and the source of the load FET become at the same voltage. When at least one of the current control FETs takes the on-state, if the voltage $V_{DS}$ between the drain and the source is made sufficiently small, the gate of the load FET and the source of the switching FET become at the same voltage. That is, the logic gate circuit described in the seventh aspect of the present invention to which the OR function toward multiple current control signals has been added can be obtained.

According to an ninth aspect of the present invention, in the logic gate circuit described in the first aspect of the present invention, the current limiting circuit comprises a plurality of current control signal input terminals and the same number of current control FETs connected in series as the current control signal input terminals, each current control FET having a drain, a source, and a gate, the drain of one of the current control FETs at one end of the series being one end of the current limiting circuit, the source of another one of the current control FETs at the other end of the series being the other end of the current limiting circuit, and the gate of each current control FET being one of the current control signal input terminals. Therefore, only when all these current control FETs take the on-state, the gate voltage of the load FET and the source voltage of the switching FET become at the same voltage. When at least one of the current control FETs takes the off-state, the gate and the source of the load FET become at the same voltage. That is, the logic gate circuit described in the seventh aspect of the present invention to which the AND function toward multiple current control signals has been added can be obtained.

According to a tenth aspect of the present invention, the logic gate circuit described in the first aspect of the present invention further comprises a capacitor having two ends, one end of the capacitor being connected to the gate of the switching FET and the other end of the capacitor being connected to the gate of the load FET.

Generally in a logic gate circuit having a switching FET and a load FET, when the signal voltage at the input terminal changes from low to high, the switching FET changes its state from the off-state to the on-state. The current then flows from the gate of the next stage FET which is connected to the output terminal to the low voltage power source terminal through the wiring and the switching FET in the on-state whose source is connected to the low voltage power source terminal, discharging the gate-source capacitance $C_{gs}$ the next stage FET and the wiring capacitance $C_L$ and the signal voltage at the output terminal changes from high to low. The discharge current in this case is equal to the difference between the current which can flow through the on-state switching FET and the current which flow through the load FET. The larger this discharge current is, the faster the discharging rate becomes, and in order to have a larger discharge current and a faster discharging rate, it is advantageous to make the current flowing through the load FET smaller. However, when the logic gate circuit described in the first aspect of the present invention does not have the capacitor, and when the gate voltage of the load FET becomes the voltage determined by dividing the voltage difference between the source voltage of the load FET (that is, the signal voltage at the output terminal) and the source voltage of the switching FET (that is, the voltage of the low voltage power source) by the first and the second resistors or the gate voltage of the load FET is fixed to the source voltage of the switching FET, since the gate voltage of this load transistor approaches to the signal voltage at the output terminal as this signal voltage decreases, the voltage between the gate and the source of the load FET (the gate potential on the basis of the source potential) $V_{gs}<0$ approaches to zero. As a result, the current flowing between the drain and the source of the load FET increases and, consequently, the discharging current decreases, thereby reducing the discharging rate by that amount.

On the contrary, in the logic gate circuit having the above capacitor, since it is necessary to charge/discharge the capacitor in order to change the gate voltage of the load FET, the rate of change in the gate voltage of the load FET is reduced. Therefore, the time at which the current flowing through the load FET starts to increase can be delayed, whereby the reduction of the discharging rate can be suppressed.

On the other hand, when the signal voltage at the input terminal changes from high to low, the switching FET changes its state from the on-state to the off-state, and the current then flows to the gate of the next stage FET through the load FET and the wiring, and the gate-source capacitance $C_{gs}$ of the next stage FET and the wiring capacitance $C_L$ are charged, thereby changing the signal voltage at the output terminal from low to high. The charging current in this case is the current flowing through the load FET. The larger this charging current is, the faster the charging rate becomes, and in order to have the larger charging current and the faster charging rate, it is advantageous to make the current flowing through the load FET larger. However, when the logic gate circuit described in the first aspect of the present invention do not have the capacitor, and when the gate voltage of the load FET becomes the voltage determined by dividing the voltage difference between the source voltage of the load FET (that is, the signal voltage at the output terminal) and the source voltage of the switching FET (that is, the voltage of the low voltage power source) by the first and the second resistors or the gate voltage of the load FET is fixed to the source voltage of the switching FET, since the gate voltage of this load transistor increases as the signal voltage at the output terminal increases, and since the increase in this signal voltage is larger than the increase in the gate voltage of the load transistor, the voltage $V_{gs}<0$ between the gate and the source of the load FET increases in the absolute value. As a result, the current flowing between the drain and the source of the load FET decreases so that the above described charging current decreases, whereby the charging rate is reduced.

On the contrary, in the logic gate circuit having the above capacitor, the rate of change in the gate voltage of the load FET is reduced because of the capacitor and, therefore, the time at which the current flowing through the load FET starts to decrease can be delayed, whereby the reduction in the charging rate can be suppressed.

As described above, in the logic gate circuit of the tenth aspect of the present invention, the degradation of operating speed can be controlled by reducing the rate of change in the gate voltage of the load FET in response to the change in the signal voltage at the output terminal.

According to a eleventh aspect of the present invention, a logic gate circuit comprises an input terminal and an output terminal; a first resistor having two ends; a current limiting circuit having two ends; a switching FET having a drain and a gate; a load FET having a source, a gate, and a drain; the source of the load FET being connected to the drain of the switching FET; the gate of the switching FET being the input terminal; the drain of the switching FET being connected to the output terminal; one end of the first resistor being connected to the source of the load FET and the other end of the first resistor being connected to the gate of the load FET; and one end of the current limiting circuit being connected to the gate of the load FET and the other end of the current limiting circuit being connected to the drain of the load FET. Therefore, the gate voltage of the load FET can be made closer to its drain voltage than to its source voltage, and the current flowing between the drain and the source of the load FET, that is the dissipation current of the logic gate circuit can be made larger than that of the prior art DCFL gate circuit previously described. Therefore, when a gate width of a load FET in a DCFL gate circuit in a low speed operation section of a digital LSI is chosen to be the minimum gate width $W_{gmin}$ which is determined by fabrication processes and its threshold voltage is determined in accordance with this minimum gate width, by using the above logic gate circuit according to the eleventh aspect of the present invention in the high speed operating section, the dissipation current can be increased even though the gate width and the threshold voltage of the load FET are the same as those in the low speed operating section. And since the gate width of the load FET in the high speed operating section can be made narrower than in the case in which a DCFL circuit is used, the chip area of the LSI can be reduced.

According to a twelfth aspect of the present invention, in the logic gate circuit described in the eleventh aspect of the present invention, the current limiting circuit comprises a second resistor having two ends, one end of the second resistor being the one end of the current limiting circuit and the other end of the second resistor being the other end of the current limiting circuit. Therefore, the gate voltage of the load FET can be made to be the voltage which is determined by dividing a voltage difference between the source voltage of the load FET and the drain voltage of the load FET by the first and the second resistors. Since the voltage determined by this division becomes closer to the drain voltage of the load FET than to the source voltage of the load FET, the dissipation current of the logic gate circuit can be made larger than that of the prior art DCFL gate circuit previously described. Therefore, when the gate width of the load FET in the DCFL gate circuit in the low speed operating section of a digital LSI is chosen to be the minimum gate width $W_{gmin}$ and its threshold voltage is determined in accordance with this minimum gate width, by using the above logic gate circuit according to the twelfth aspect of the present invention in the high speed operating section, the dissipation current can be increased even though the gate width and the threshold voltage of the load FET are the same as those in the low speed operating section. And since the gate width of the load FET in the high speed operating section can be made narrower than in the case in which a DCFL circuit is used, the chip area of the LSI can be reduced.

According to a thirteenth aspect of the present invention, in the logic gate circuit described in the eleventh aspect of the present invention, the current limiting circuit comprises a current control element comprising a current control signal input terminal, a second resistor having two ends, one end of the second resistor being the one end of the current limiting circuit, and a current control FET having a source, a drain, and a gate, the drain being the other end of the current limiting circuit, the source being connected to the other end of the second resistor, and the gate being connected to the current control signal input terminal. Therefore, when the signal voltage at the current control signal input terminal is high, the current control FET takes the on-state, and if the voltage $V_{DS}$ between the drain and the source of the current control FET in this case is made sufficiently smaller than the voltage drop due to the first and the second resistors, the gate voltage of the load FET can be made to be the voltage determined by dividing the voltage difference between the source voltage of the load FET and the drain voltage of the load FET by the first and the second resistors, and the dissipation current of the logic gate circuit can be made larger than that of the prior art DCFL gate circuit previously described. Moreover, when the signal voltage at the current control signal input terminal is low, the current control FET takes the off-state and the gate voltage of the load FET becomes the same as its source voltage due to the first resistor, and the dissipation current of the logic gate circuit becomes smaller than in the case in which the current control FET is in the on-state. Therefore, the dissipation current can be increased by making the current control FET in the on-state only when the high speed operation of the logic gate circuit is required. In other cases, the dissipation current can be reduced by making the current control FET in the off-state. As described above, the power dissipation of the LSI can be reduced by using this logic gate circuit.

However, in the case in which the load FET is an enhancement type FET, the voltage between the gate and the source of the load FET when the current control FET is in the on-state is made to be larger than the threshold voltage of the load FET. Furthermore, if the current control FET is made to be in the off-state and the gate and the source of the load FET is made to be at the same voltage, then there is no current through the load FET which is the enhancement type FET and the logic gate circuit ceases functioning. Therefore, in this case, the current control FET can be made to be in the on-state only when the operation of the logic gate circuit is required and the current control FET can be made to be in the off-state so that the operation of the logic gate circuit is suspended when the operation is not required, and as a result, by using this logic gate circuit in a section which operates only for a certain time interval and does not operate for other times, the power dissipation of the LSI can be reduced.

According to an fourteenth aspect of the present invention, in the logic gate circuit described in the eleventh aspect of the present invention, the current limiting circuit comprises a plurality of current control elements connected in parallel, each current control element comprising a current control signal input terminal, a second resistor having two ends, one end of the second resistor being connected to the one end of the current limiting circuit, and a current control FET having a source, a drain, and a gate, the drain being connected to the other end of the current limiting circuit, the source being connected to the other end of the second resistor, and the gate being the current control signal input terminal. Therefore, by choosing the signal voltages at each current control signal input terminal to be high or low, only specified current control FETs can be made to be in the on-state and other current control FETs in the off-state, and the gate voltage of the load FET can be made to be the voltage determined by dividing the voltage difference between the source voltage of the load FET and the drain voltage of the load FET by the composite resistor of the second resistors connected parallel and connected to the current control FETs in the on-state and the first resistor. Here, the drain-source voltage $V_{DS}$ of the current control FET in the on-state is made to be sufficiently smaller than the voltage drop due to the first and the second resistors. Therefore, by changing the combination of the current control FETs to be in the on-state, the gate voltage of the load FET can be changed and the dissipation current can be adjusted, thereby easily optimizing the dissipation current of each logic gate circuit. Furthermore, by using this logic gate circuit, the power dissipation of the LSI can be reduced.

According to a fifteenth aspect of the present invention, in the logic gate circuit described in the thirteenth aspect or the fourteenth aspect of the present invention, each current control element comprises a plurality of current control signal input terminals, a second resistor having two ends, one end of the second resistor being connected to the one end of the current limiting circuit, and the same number of current control FETs connected in parallel as the current control signal input terminals, each current control FET having a gate, a drain, and a source, the source being connected to the other end of the second resistor, the gate being one of the current control signal input terminals, and the drain being connected to the other end of the current limiting circuit. Therefore, only when all these current control FETs take the off-state, the gate and the source of the load FET become at the same voltage, and when at least one of the current control FETs takes the on-state, the gate voltage of the load FET becomes the voltage determined by dividing the voltage difference between the source voltage of the load FET and the drain voltage of the load FET by the first and the second resistors. That is, the logic gate circuit described in the thirteenth or the fourteenth aspects of the present invention to which the OR function toward multiple current control signals has been added can be obtained.

According to a sixteenth aspect of the present invention, the logic gate circuit described in the thirteenth aspect or the fourteenth aspect of the present invention, the current control element comprises a plurality of current control signal input terminals, a second resistor having two ends, one end of the second resistor being connected to the one end of the current limiting circuit, and the same number of current control FETs connected in series as the current control signal input terminals, each current control FET having a gate, a drain, and a source, the drain of one of the current control FETs at one end of the series being connected to the other end of the current limiting circuit, the source of another one of the current control FETs at the other end of the series being connected to the other end of the second resistor, and the gate being one of the current control signal input terminals. Therefore, only when all these current control FETs take the on-state, the gate voltage of the load FET becomes the voltage determined by dividing the voltage difference between the source voltage of the load FET and the drain voltage of the load FET by the first and the second resistor, and when at least one of the current control FETs takes the off-state, the gate and the source of the load FET become at the same voltage. That is, the logic gate circuit described in the seventeenth or the eighteenth aspects of the present invention to which the AND function toward multiple current control signals has been added can be obtained.

According to a seventeenth aspect of the present invention, in the logic gate circuit described in the eleventh aspect of the present invention, the current limiting circuit comprises a current control signal input terminal and a current control FET having a drain, a source, and a gate, the source being one end of the current limiting circuit, the drain being the other end of the current limiting circuit, and the gate being the current control signal input terminal. Therefore, when the current control FET is in the on-state, if the voltage $V_{DS}$ between the drain and the source of the current control FET is made sufficiently small, the gate and the drain of the load FET can be made to be at the same voltage and the dissipation current of the logic gate circuit can be made larger than that of the prior art DCFL gate circuit previously described. Moreover when the current control FET is in the off-state, the gate and the source of the load FET become at the same voltage due to the first resistor, and the dissipation current in the logic gate circuit becomes smaller than in the case in which the current control FET is in the on-state. Therefore, the dissipation current can be increased by making the current control FET to be in the on-state only when the high speed operation of the logic gate circuit is required, and in other cases, the dissipation current can be reduced by making the current control FET to be in the off-state. As described above, by using this logic gate circuit, the power dissipation of the LSI can be reduced. Furthermore, since this logic gate circuit has the arrangement of the logic gate circuit described in the thirteenth aspect of the present invention from which the second resistor has been removed, the chip area of the LSI can be reduced by that amount.

However, in the case in which the load FET is an enhancement type FET, the voltage between the gate and the source of the load FET when the current control FET is in the on-state is made to be larger than the threshold voltage of the load FET. Furthermore, if the current control FET is in the off-state and the gate and the source of the load FET is made to be at the same voltage, then there is no current flowing through the load FET which is the enhancement type FET and the logic gate circuit ceases functioning. Therefore, in this case, the current control FET can be made to be in the on-state only when the operation of the logic gate circuit is required and the current control FET can be made to be in the off-state so that the operation of the logic gate circuit is suspended when the operation is required, and as a result, by using this logic gate circuit in a section which operates only for a certain time interval and does not operate for other times, the power dissipation of the LSI can be reduced.

According to a eighteenth aspect of the present invention, in the logic gate circuit described in the eleventh aspect of the present invention, the current limiting circuit comprises a plurality of current control signal input terminals and the same number of current control FETs connected in parallel as the current control signal input terminals, each current control FET having a drain, a source, and a gate, the source being connected to one end of the current limiting circuit, the drain being connected to the other end of the current limiting circuit, and the gate being one of the current control signal input terminals. Therefore, only when all these current control FETs take the off-state, the gate and the source of the load FET become at the same voltage, and when at least one of the current control FETs takes the on-state, if the voltage $V_{DS}$ between the drain and the source of the current control FET is made sufficiently small, the gate and the drain of the load FET become at the same voltage. That is, the logic gate circuit described in the seventeenth aspect of the present invention to which the OR function toward multiple current control signals has been added can be obtained.

According to a nineteenth aspect of the present invention, in the logic gate circuit described in the eleventh aspect of the present invention, the current limiting circuit comprises a plurality of current control signal input terminals and the same number of current control FETs connected in series as the current control signal input terminals, each current control FET having a drain, a source, and a gate, the source of one of the current control FETs at one end of the series being one end of the current limiting circuit, the drain of another one of the current control FETs at the other end of the series being the other end of the current limiting circuit, and the gate of each current control FET being one of the current control signal input terminals. Therefore, only when all these current control FETs take the on-state, the gate voltage and the drain voltage of the load FET become at the same voltage, and when at least one of the current control FETs takes the off-state, the gate and the source of the load FET become at the same voltage. That is, the logic gate circuit described in the seventeenth aspect of the present invention to which the AND function toward multiple current control signals has been added can be obtained.

According to a twentieth aspect of the present invention, the logic gate circuit described in the eleventh aspect of the present invention further comprises a capacitor having two ends, one end being connected to the source of the load FET and the other end being connected the gate of the load FET.

Generally in a logic gate circuit having a switching FET and a load FET, when the signal voltage at the input terminal changes from low to high, current flows from the gate of the next stage FET which is connected to the output terminal to the source of the switching FET (the low voltage power source terminal) through the wiring and the switching FET in the on-state, discharging the gate-source capacitance $C_{gs}$ of the next stage FET and the wiring capacitance $C_L$ and the signal voltage at the output terminal changes from high to low. The discharge current in this case is equal to the difference between the current which flow through the on-state switching FET and the current which flows through the load FET. Therefore, the smaller the current which flows through the load FET is, the higher the discharging rate becomes. However, the logic gate circuit described in the thirteenth aspect of the present invention do not have the above capacitor, and when the gate voltage of the load FET becomes the voltage determined by dividing the voltage difference between the source voltage of the load FET (that is, the signal voltage at the output terminal) and the drain voltage of the load FET (that is, the voltage of the high voltage power source) by the first and the second resistors or the gate voltage of the load FET is fixed to its drain voltage, since the gate voltage of this load FET either decreases or remains constant as the signal voltage at the output terminal decreases but the signal voltage at the output terminal decreases more than the decrease in the gate voltage of the load FET, the voltage between the gate and the source of the load FET (the gate potential on basis of the source potential) $V_{gs}>0$ increases. As a result, the current flowing between the drain and the source of the load FET increases and the discharging current decreases, thereby reducing the discharging rate by that amount.

On the contrary, in the logic gate circuit having the above capacitor, since it is necessary to charge/discharge the capacitor in order to change the voltage $V_{gs}$ of the load FET, the rate of change in the voltage $V_{gs}$ of the load FET is reduced and, therefore, the time at which the current flowing through the load FET starts to increase can be delayed, whereby the reduction of the discharging rate can be suppressed.

On the other hand, when the signal voltage at the input terminal changes from high to low, because of the current flowing to the gate of the next stage FET through the load FET and the wiring, the gate-source capacitance $C_{gs}$ of the next stage FET and the wiring capacitance $C_L$ are charged, thereby changing the signal voltage at the output terminal from low to high. The charging current in this case is the current which flows through the load FET, and the larger this current is, the higher the charging rate becomes. However, when the logic gate circuit described in the eleventh aspect of the present invention do not have the above capacitor, and when the gate voltage of the load FET becomes the voltage determined by dividing the voltage difference between the source voltage and the drain voltage of the load FET by the first and the second resistors or the gate voltage of the load FET is fixed to its drain voltage, since the gate voltage of the load FET approaches to the signal voltage at the output terminal as the signal voltage increases, the voltage $V_{gs}>0$ between the gate and the source of the load FET decreases. As a result, the current flowing between the drain and the source of the load FET decreases so that the charging current described above decreases, whereby the charging rate can be reduced.

On the contrary, in the logic gate circuit having the above capacitor, the rate of change in the voltage $V_{gs}$ of the load FET is reduced because of the capacitance of this capacitor so that the time at which the current flowing through the load FET starts to decrease can be delayed, whereby the reduction of the charging rate can be suppressed.

As described above, in the logic gate circuit of the twentieth aspect of the present invention, the degradation of operating speed can be controlled by reducing the rate of change in the voltage $V_{gs}$ of the load FET in response to the change in the signal voltage at the output terminal.

DETAILED DESCRIPTION OF THE PREFERRED EMBODIMENTS

[Embodiment 1]

A first embodiment of the present invention will be described.

Figure 1:
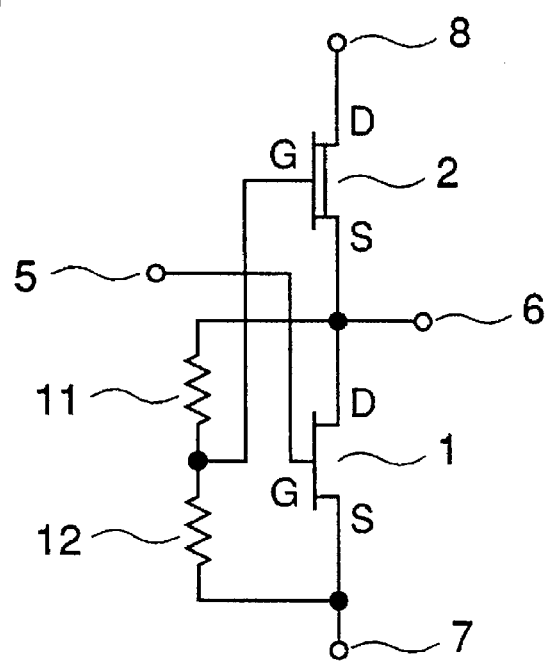
FIG. 1 is a circuit diagram illustrating a logic gate circuit according to a first embodiment of the present invention.

FIG. 1 is a circuit diagram illustrating a logic gate circuit of the first embodiment of the present invention. In the figure, reference numeral 1 designates a switching FET, reference numeral 2 designates a depletion type load FET, reference numeral 5 designates an input terminal, reference numeral 6 designates an output terminal, reference numeral 7 designates a low voltage ($V_{SS}$) power source terminal, reference numeral 8 designates a high voltage ($V_{DD}$) power source terminal, reference numeral 11 designates a first resistor ($R_1$), and reference numeral 12 designates a second resistor ($R_2$). The letters G, D, and S designate a gate, a drain, and a source of the FETs, respectively. (Since, in the following figures, the arrangement of the gate, the drain, and the source of FETs is the same, the designation by those letters will be omitted.) In this logic gate circuit, $V_{DD} > V_{SS}$. The first and the second resistors 11 and 12 are connected in series between the drain and the source of the switching FET1, that is, between the output terminal 6 and the $V_{SS}$ power source terminal 7, and the gate of the load FET2 is connected to the connecting point of the first and the second resistors.

The operation of the logic gate circuit according to the first embodiment of the present invention will be described. When the signal voltage at the input terminal (abbreviated as "input", hereinafter) is high, the switching FET1 takes the on-state and the signal voltage at the output terminal (abbreviated as "output", hereinafter) becomes low. If $V_L$ designates low level voltage, the voltage $V_{gs}$ between the gate and the source of the load FET2 in this case becomes $$V_{gs}=R_1(V_{SS}-V_L)/(R_1+R_2),$$

and is smaller than $V_{gs}$ (=0 V) of the prior art DCFL gate circuit, and the current flowing between the drain and the source of the load FET, that is, the dissipation current can be reduced and the power dissipation of the logic gate circuit can be reduced.

When the input is low, the switching FET1 takes the off-state and the output becomes high. If $V_H$ designates high level voltage, the voltage $V_{gs}$ of the load FET2 in this case becomes $$V_{gs}=R_1(V_{SS}-V_H)/(R_1+R_2),$$

and is smaller than $V_{gs}$ (=0 V) of the prior art DCFL circuit, as in the case in which the input is high, and the power dissipation of the logic gate circuit can be reduced.

According to the first embodiment of the present invention, in a digital LSI, by applying the logic gate circuit described above to a low speed operating section, the gate width of a load FET in a logic gate circuit whose dissipation current is the least in a high speed operating section can be chosen to be $W_{gmin}$ and the threshold voltages of all load FETs in the LSI can be fit to this load FET. As a result, the chip area of the LSI can be reduced and its power dissipation can be decreased.

[Embodiment 2]

A second embodiment of the present invention will be described.

Figure 2:
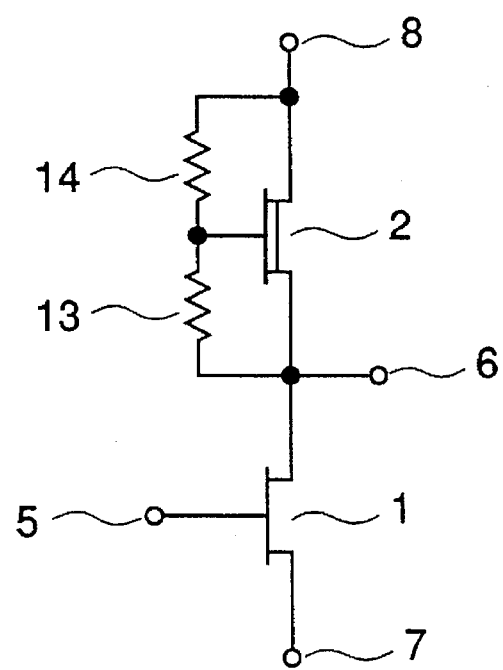
FIG. 2 is a circuit diagram illustrating a logic gate circuit according to a second embodiment of the present invention.
Figure 3:
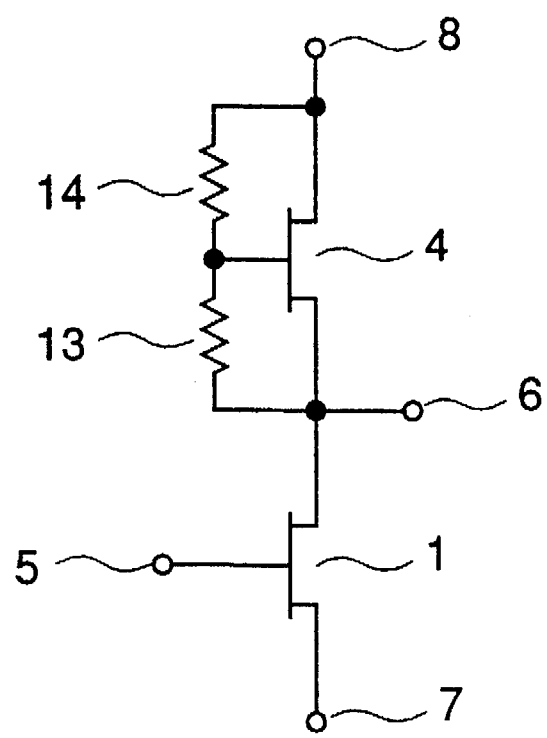
FIG. 3 is a circuit diagram illustrating another logic gate circuit according to the second embodiment of the present invention.

FIGS. 2 and 3 are circuit diagrams illustrating a logic gate circuit according to the second embodiment of the present invention. In the figures, reference numeral 4 designates an enhancement type load FET, reference numeral 13 designates a first resistor ($R_1$), and reference numeral 14 designates a second resistor ($R_2$). The same parts as in FIG. 1 are designated by the same reference numerals, and the description for them is omitted (so are they for the following figures). The first resistor 13 and the second resistor 14 are connected in series between the drain and the source of the load FET2 or FET4, that is, between the $V_{DD}$ power source terminal and the output terminal, and the gate of the load FET2 or FET4 is connected to the connecting point of the first and the second resistors.

The operation of the logic gate circuit illustrated in FIG. 2 according to the second embodiment of the present invention will be described. When the input is high, the switching FET1 takes the on-state and the output becomes low. The voltage $V_{gs}$ between the gate and the source of the load FET2 in this case becomes $$V_{gs}=R_1(V_{DD}-V_L)/(R_1+R_2),$$

and is larger than $V_{gs}$ (=0 V) of the prior art DCFL gate circuit, and the current flowing between the drain and the source of the load FET, that is, the dissipation current, can be increased.

When the input is low, the switching FET1 takes the off-state and the output becomes high. If $V_H$ designates high level voltage, the voltage $V_{gs}$ of the load FET2 in this case becomes $$V_{gs}=R_1(V_{DD}-V_H)/(R_1+R_2),$$

and is larger than $V_{gs}$ (=0 V) in the prior art DCFL circuit, as in the case in which the input is high, and the dissipation current in the logic gate circuit can be increased.

In the logic gate circuit illustrated in FIG. 3 according to the second embodiment of the present invention, if $R_1$ and $R_2$ are set so that the $V_{gs}$ corresponding to the input of high or low becomes larger than the threshold voltage $V_{te}$ ($\geq 0$ V) of the enhancement type load FET4, its operation becomes the same as that of the logic gate circuit illustrated in FIG. 2.

According to the second embodiment of the present invention, in a digital LSI, even when the gate width of the load FET in a DCFL gate circuit whose dissipation current is the least in the low speed operating section ts chosen to be $W_{gmin}$, and the threshold voltages of all load FETs in the LSI is fit to this load FET, by applying the logic gate circuit of the second embodiment to the high speed operating section, the dissipation current of the logic gate circuit can be increased and high speed operation can be made possible, even though the gate width of the load FET is made narrower than in a case in which the DCFL circuit is used. As a result, the chip area of the LSI can be reduced.

Furthermore, according to the logic gate circuit illustrated in FIG. 3 of the second embodiment of the present invention, by utilizing an enhancement type FET whose threshold voltage is the same as that of switching FET1 as the load FET4, the ion implantation for forming channels of the load FET and the switching FET can be conducted in a single step during the fabrication of the LSI, thereby simplifying the fabrication process.

[Embodiment 3]

A third embodiment of the present invention will be described.

Figure 4:
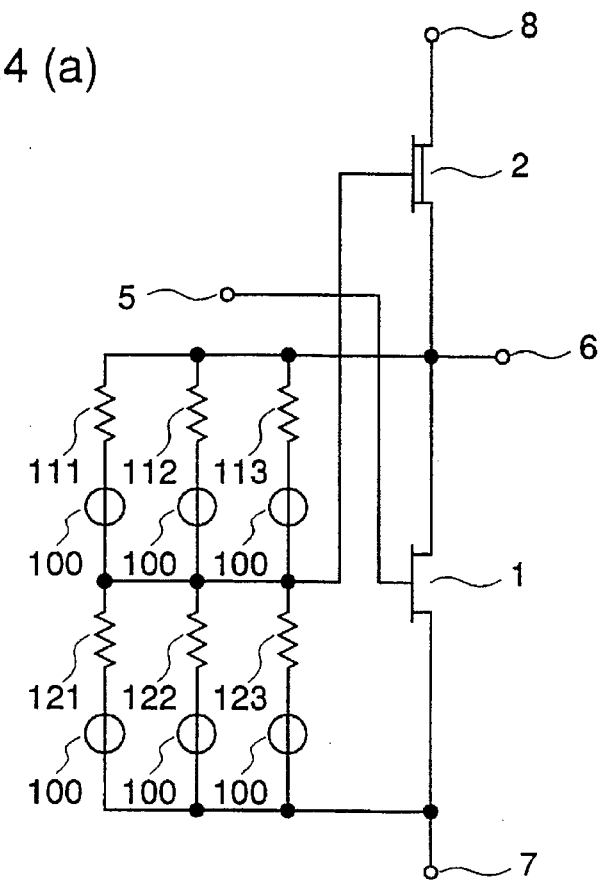
FIGS. 4(a) and 4(b) are circuit diagrams illustrating logic gate circuits according to a third embodiment of the present invention.
Figure 4:
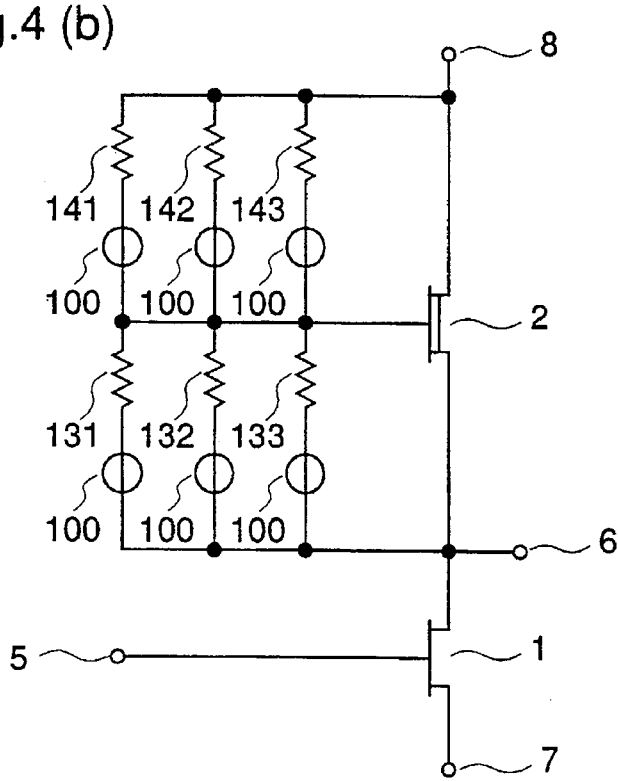

FIGS. 4(a) and 4(b) are circuit diagrams illustrating a logic gate circuit according to the third embodiment of the present invention. In the figures, reference numeral 100 designates a breakable wiring such as a fuse which can be opened by current flow, a laser cutter or the like, reference numerals 111, 112, 113, 131, 132, and 133 designate first resistors, and reference numerals 121, 122, 123, 141, 142, and 143 designate second resistors. The logic gate circuit in FIG. 4(a) is the same as described in the first embodiment of the present invention except that the first resistor has been replaced with a set of three first resistors 111, 112, and 113 connected in parallel, each resistor being connected to the breakable wiring 100, and the second resistor has been replaced with a set of three second resistors 121, 122, and 123 connected in parallel, each resistor being connected to the breakable wiring 100. The logic gate circuit in FIG. 4(b) is the same as the logic gate circuit described in the second embodiment of the present invention except that the first resistor has been replaced with a set of three first resistors 131, 132, and 133 connected in parallel, each resistor being connected to the breakable wiring 100, and the second resistor has been replaced with a set of three second resistors 141, 142, and 143 connected in parallel, each resistor being connected to the breakable wiring 100.

In the logic gate circuit of the third embodiment of the present invention, since the first resistors and the second resistors are arranged as described above, the voltage $V_{gs}$ of the load FET can be adjusted for each logic gate circuit by opening some of the breakable wirings 100 after completing fabricating processes of the LSI to obtain a composite resistance due to the first and the second resistors which are connected to the breakable wirings which remain closed, thereby optimizing the dissipation current for each logic gate circuit. As a result, not only the chip area of the LSI can be reduced but the power dissipation can be reduced more than in a case in which the logic gate circuits of the first and the second embodiments are used.

The first resistors and the second resistors, each of which is connected in series to the breakable wiring, can be arranged in an arbitrary number of parallel connections.

[Embodiment 4]

A fourth embodiment of the present invention will be described.

Figure 5:
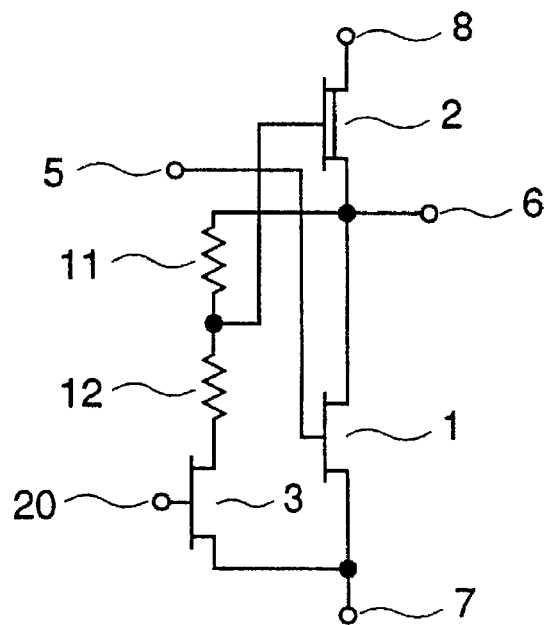
FIG. 5 is a circuit diagram illustrating a logic gate circuit according to a fourth embodiment of the present invention.

FIG. 5 is a circuit diagram illustrating a logic gate circuit according to the fourth embodiment of the present invention. In the figure, reference numeral 3 designates a current control FET and reference numeral 20 designates a current control signal input terminal. This logic gate circuit is the same as the first embodiment of the present invention except that the current control FET3 is added. The drain and the source of this current control FET3 are connected in series with the second resistor 12 on the $V_{SS}$ side of this resistor.

In the logic gate circuit of the fourth embodiment of the present invention, when the signal voltage at the current control signal input terminal 20 is high, the current control FET3 takes the on-state, and if the voltage $V_{DS}$ between the drain and the source of the current control FET3 is then made sufficiently smaller than the voltage drop due to the first and the second resistors, the voltage $V_{gs}$ of the load FET2 becomes $$V_{gs}=R_1(V_{SS}-V_{OUT})/(R_1+R_2)\ (<0),$$

where $V_{OUT}$ is the signal voltage at the output terminal and takes a value of either $V_H$ or $V_L$. As a result, the dissipation current can be made smaller than in the prior art DCFL gate circuit as in the logic gate circuit described in the first embodiment. Moreover, when the signal voltage at the current control signal input terminal 20 is low, the current control FET3 takes the off-state, and since the gate of the load FET is connected to the source of the load FET by the first resistor, the voltage $V_{gs}$ of the load FET2 becomes $V_{gs}=0$. As a result, since the dissipation current of the logic gate circuit becomes larger than in the case in which the current control FET3 is in the on-state, the operating speed of the logic gate circuit can be increased. As a result, the dissipation current can be increased by having the current control FET in the off-state only when the high speed operation of the logic gate circuit is required, and in other cases, the dissipation current can be reduced by having the current control FET in the on-state. Therefore, by using this logic gate circuit in a section which operates with high speed for a specific time interval and with low speed for other times, the power dissipation of the LSI can be reduced.

[Embodiment 5]

A fifth embodiment of the present invention will be described.

Figure 6:
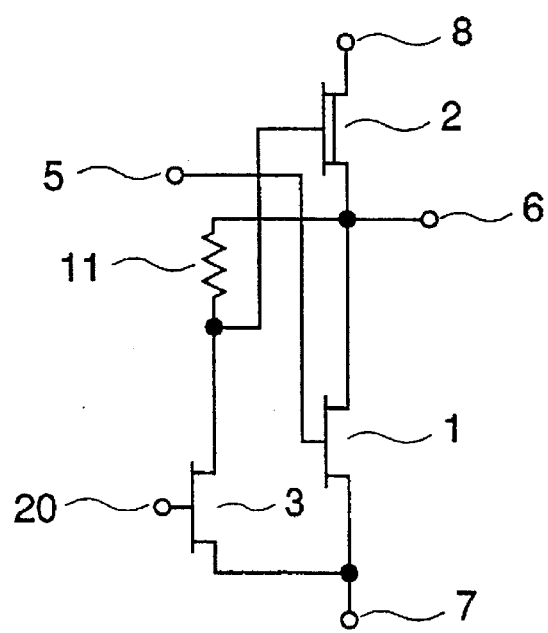
FIG. 6 is a circuit diagram illustrating a logic gate circuit according to a fifth embodiment of the present invention.

FIG. 6 is a circuit diagram illustrating a logic gate circuit according to the fifth embodiment of the present invention. This logic gate circuit is the same as in the first embodiment of the present invention except that the second resistor has been replaced with the current control FET3, and the drain of the current control FET3 is connected to the first resistor 11 and the gate of the load FET2, and the source of the current control FET3 is connected to the $V_{SS}$ power source terminal 7, that is, to the source of the switching FET1.

In the logic gate circuit of the fifth embodiment of the present invention, when the signal voltage at the current control signal input terminal 20 is high, the current control FET3 takes the on-state, and if the voltage $V_{DS}$ between the drain and the source of the current control FET3 is then made significantly smaller than the voltage drop due to the first resistor 11, the gate of the load FET2 becomes connected to the $V_{SS}$ power source terminal by the drain-source of the current control FET3 and the voltage $V_{gs}$ of the load FET2 becomes $$V_{gs}=V_{SS}-V_{OUT}\ (<0),$$

where $V_{OUT}$ takes a value of either $V_H$ or $V_L$. As a result, the dissipation current can be made smaller than in the prior art DCFL gate circuit previously described as in the logic gate circuit described in the first embodiment. Moreover, when the signal voltage at the current control signal input terminal 20 is low, the current control FET3 takes the off-state, and the voltage $V_{gs}$ of the load FET2 becomes $$V_{gs}=0$$

as in the case of the logic gate circuit described in the fourth embodiment. Since the dissipation current of the logic gate circuit becomes larger than in the case in which the above current control FET3 takes the on-state, the operation speed of the logic gate circuit can be made faster. As a result, the dissipation current can be increased by having the current control FET in the off-state only when the high speed operation of the logic gate circuit is required, and in other cases, the dissipation current can be reduced by having the current control FET in the on-state. Therefore, by using this logic gate circuit in a section which operates with high speed for a specific time interval and with low speed for other times, the power dissipation of the LSI can be reduced. Furthermore, since this logic gate circuit has an arrangement which is the same as that of the logic gate circuit described in the fourth embodiment except that the second resistor 12 is removed, the chip area of the LSI can be made smaller than in the case of the logic gate circuit in the fourth embodiment by the area of the second resistor.

[Embodiment 6]

A sixth embodiment of the present invention will be described.

Figure 7:
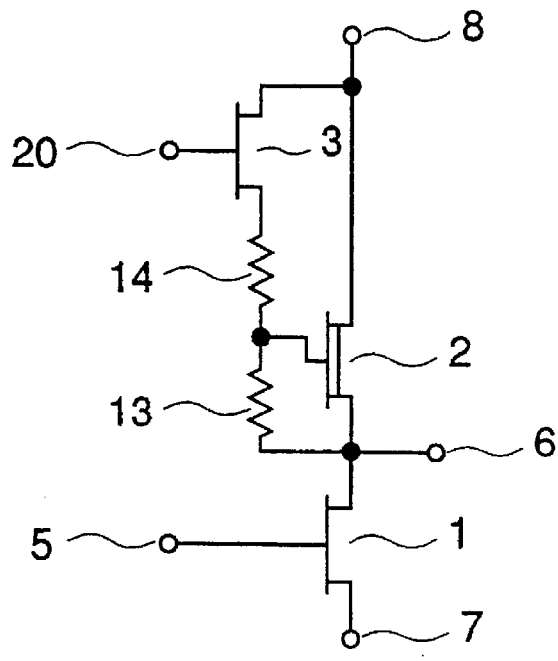
FIG. 7 is a circuit diagram illustrating a logic gate circuit according to a sixth embodiment of the present invention.

FIG. 7 is a circuit diagram illustrating a logic gate circuit according to the sixth embodiment of the present invention. This logic gate circuit is the same as the second embodiment except that a current control FET3 is further added. The drain-source of this current control FET3 is connected in series with the second resistor 14 on the $V_{DD}$ side of this resistor.

In the logic gate circuit of the sixth embodiment of the present invention, when the signal voltage at the current control signal input terminal 20 is low, the current control FET3 takes the off-state, and since the gate of the load FET is connected to the source of the load FET by the first resistor 13, the voltage $V_{gs}$ of the load FET2 becomes $$V_{gs}=0.$$

This is the same state as for the DCFL circuit. On the other hand, when the signal voltage at the current control signal input terminal 20 is high, the current control FET3 takes the on-state, and if the voltage $V_{DS}$ between the drain and the source of this FET is then made significantly smaller than the voltage drop due to the first resistor 13 and the second resistor 14, the voltage $V_{gs}$ of the load FET2 becomes $$V_{gs}=R_1(V_{DD}-V_{OUT})/(R_1+R_2)\ (>0),$$

where $V_{OUT}$ takes a value of either $V_H$ or $V_L$. As a result, as in the logic gate circuit described in the second embodiment, the dissipation current can be made larger than in the case in which the current control FET3 takes the off-state and the operation speed of the logic gate circuit can be increased. As a result, the dissipation current can be increased by having the current control FET3 in the on-state only when the high speed operation of the logic gate circuit is required, and in other cases, the dissipation current can be reduced by having the current control FET3 in the off-state. Therefore, by using this logic gate circuit in a section which operates with high speed for a specific time interval and with low speed for other times, the power dissipation of the LSI can be reduced.

[Embodiment 7]

A seventh embodiment of the present invention will be described.

Figure 8:
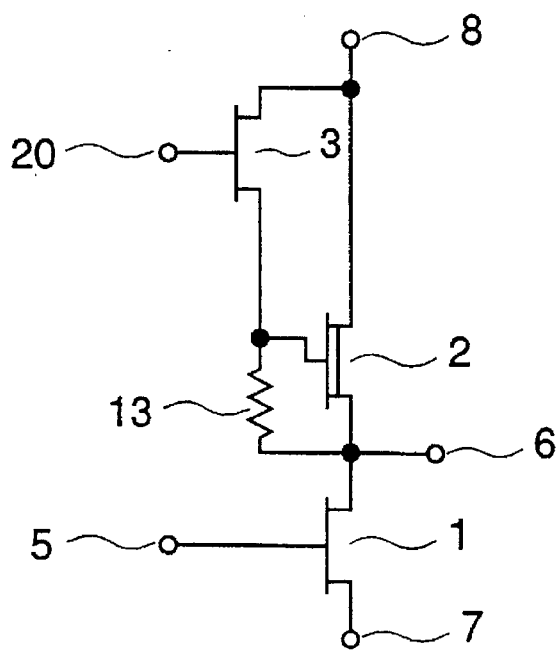
FIG. 8 is a circuit diagram illustrating a logic gate circuit according to a seventh embodiment of the present invention.

FIG. 8 is a circuit diagram illustrating a logic gate circuit according to the seventh embodiment of the present invention. This logic gate circuit is the same as the second embodiment except that the second resistor has been replaced with the current control FET3, and the source of this current control FET3 is connected to the first resistor 13 and the gate of the load FET2, and the drain of the current control FET3 is connected to the $V_{DD}$ power source terminal 8, that is, to the drain of the load FET2.

In the logic gate circuit of the seventh embodiment, when the signal voltage at the current control signal input terminal 20 is low, the current control FET3 takes the off-state, and as in the case of the logic gate circuit described in the sixth embodiment, the voltage $V_{gs}$ of the load FET2 becomes $$V_{gs}=0.$$

On the other hand, when the signal voltage at the current control signal input terminal 20 is high, the current control FET3 takes the on-state, and if the voltage $V_{DS}$ between the drain and the source of this FET is then made significantly smaller than the voltage drop due to the first resistor 13, the gate of the load FET2 becomes connected to the $V_{DD}$ power source terminal by the drain-source of the current control FET3, and the voltage $V_{gs}$ of the load FET2 becomes $$V_{gs}=V_{DD}-V_{OUT}\ (>0),$$

where $V_{OUT}$ takes a value of either $V_H$ or $V_L$. As a result, as in the logic gate circuit described in the sixth embodiment, the dissipation current can be made larger than in the case in which the current control FET3 takes the off-state, and the operation speed of the logic gate circuit can be increased. As a result, the dissipation current can be increased by having the current control FET3 in the on-state only when the high speed operation of the logic gate circuit is required, and in other cases, it can be swiched to the off-state and the dissipation current can be reduced. Therefore, by using this logic gate circuit in a section which operates with high speed for a specific time interval and with low speed for other times, the power dissipation of the LSI can be reduced. Moreover, since this logic gate circuit has an arrangement which is the same as that of the logic gate circuit described in the sixth embodiment except that the second resistor 14 is removed, the chip area of the LSI can be made smaller than in the case of the logic gate circuit in the sixth embodiment by the area of the second resistor.

[Embodiment 8]

An eighth embodiment of the present invention will be described.

Figure 9:
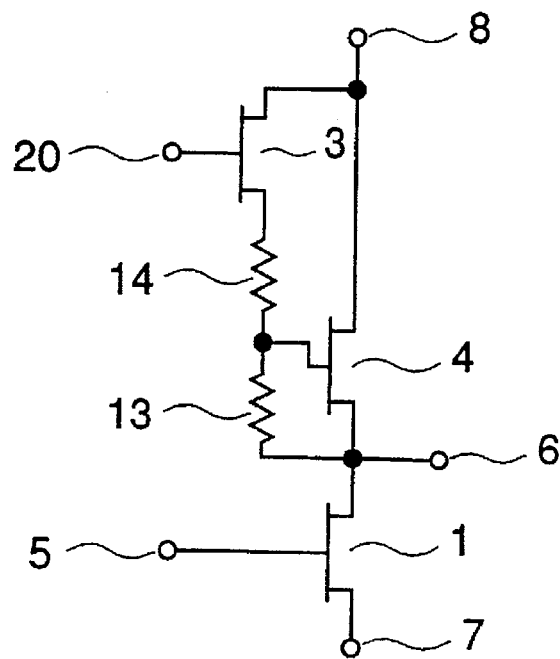
FIG. 9 is a circuit diagram illustrating a logic gate circuit according to an eighth embodiment of the present invention.

FIG. 9 is a circuit diagram illustrating a logic gate circuit according to the eighth embodiment of the present invention. This logic gate circuit is the same as the sixth embodiment except that the depletion type load FET2 has been replaced with the enhancement type FET4.

In the logic gate circuit in the eighth embodiment, the load FET in the logic gate circuit described in the sixth embodiment is not a depletion type FET but an enhancement type FET, and when the signal voltage at the current control signal input terminal 20 is low, since the current control FET3 takes the off-state and the voltage $V_{gs}$ of the load FET2 becomes $$V_{gs}=0\ V,$$

a current does not flow between the drain and the source of the load FET4. If the signal voltage at the input terminal 5 then becomes low and the switching FET1 takes the off-state, the signal voltage at the output terminal becomes indeterminate and the logic gate circuit ceases functioning. On the other hand, when the signal voltage at the current control signal input terminal 20 is high, the current control FET3 takes the on-state, and if the voltage $V_{DS}$ between the drain and the source of this FET is then made significantly smaller than the voltage drop due to the first resistor 13 and the second resistor 14, the voltage $V_{gs}$ of the load FET4 becomes $$V_{gs}=R_1(V_{DD}-V_{OUT})/(R_1+R_2)\ (>0),$$

where $V_{OUT}$ takes a value of either $V_H$ or $V_L$. Then, if $R_1$ and $R_2$ are set such that $V_{gs}>V_{te}$ ($V_{te}$ is the threshold voltage of the enhancement type load FET4), current can flow through the load FET4 and the logic gate circuit can be operated. Therefore, by using this logic gate circuit in a section which operates for a specific time interval but does not for other times, the power dissipation of the LSI can be reduced.

21

[Embodiment 9]

A ninth embodiment of the present invention will be described.

Figure 10:
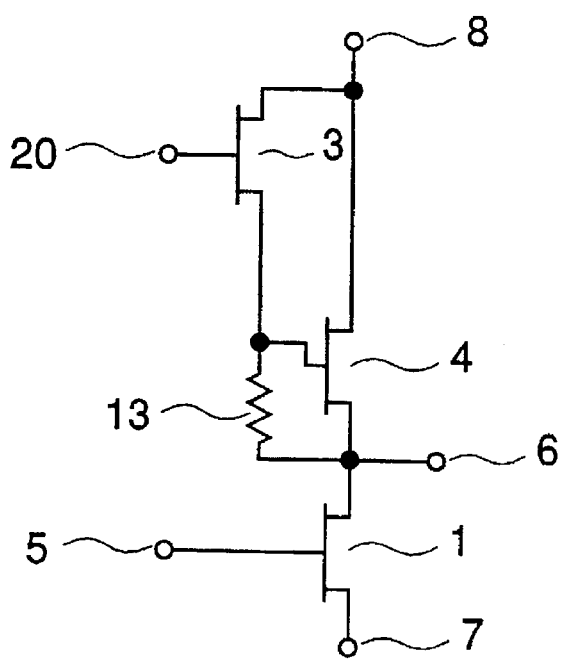
FIG. 10 is a circuit diagram illustrating a logic gate circuit according to a ninth embodiment of the present invention.

FIG. 10 is a circuit diagram illustrating a logic gate circuit according to the ninth embodiment of the present invention. This logic gate circuit is the same as the seventh embodiment except that the depletion type load FET2 in the logic gate circuit has been replaced with the enhancement type FET4.

In the logic gate circuit in the ninth embodiment, the load FET in the logic gate circuit described in the seventh embodiment is not a depletion type FET but an enhancement type FET, and when the signal voltage at the current control signal input terminal 20 is low, since the current control FET3 takes the off-state and the gate-source voltage $V_{gs}$ of the load FET4 becomes $$V_{gs}=0 \text{ V},$$

a current does not flow between the drain and the source of the load FET4 and, as in the above eighth embodiment, the logic gate circuit ceases functioning. On the other hand, when the signal voltage at the current control signal input terminal 20 is high, the current control FET3 takes the on-state, and if the voltage $V_{DS}$ between the drain and the source of the current control FET3 is then made significantly smaller than the voltage drop due to the first resistor 13, the voltage $V_{gs}$ of the load FET2 becomes $$V_{gs}=V_{DD}-V_{OUT} (>0),$$

where $V_{OUT}$ takes a value of either $V_H$ or $V_L$. If $V_{DD}$ is then set such that $V_{gs}>V_{te}$, current can flow through the load FET4 and the logic gate circuit can be operated. Therefore, by using this logic gate circuit in a section which operates for a specific time interval but does not for other times, the power dissipation of the LSI can be reduced. Furthermore, since this logic gate circuit has the same arrangement as described in the eighth embodiment except that the second resistor 14 is removed, the chip area of the LSI can be made smaller than in a case in which the logic gate circuit of the eighth embodiment is used by the area of the second resistor.

[Embodiment 10]

A tenth embodiment of the present invention will be described.

Figure 11:
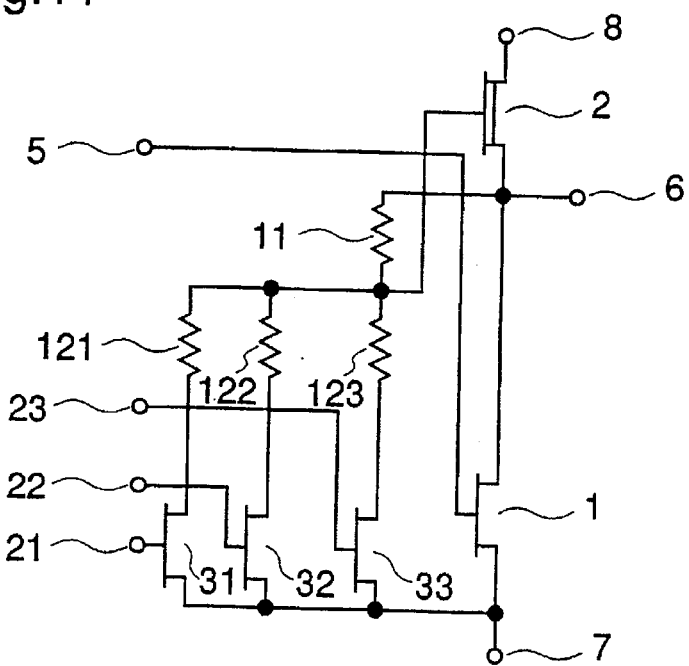
FIG. 11 is a circuit diagram illustrating a logic gate circuit according to a tenth embodiment of the present invention.

FIG. 11 is a circuit diagram illustrating a logic gate circuit according to the tenth embodiment of the present invention. In the figure, reference numerals 21, 22, and 23 designate current control signal input terminals, and reference numeral 31, 32, and 33 designate current control FETs. This logic gate circuit is the same as the fourth embodiment except that it includes three current control elements connected in parallel, each of which comprises a second resistor and a current control FET connected in series.

In the logic gate circuit of the tenth embodiment, if, for example, the signal voltages of the current control signal input terminals 21 and 23 are made high and the signal voltage at the terminal 22 is made low, only the current control FET31 and FET33 take the on-state and the current control FET32 takes the off-state, and the gate of the load FET2 becomes connected to the $V_{SS}$ power source terminal by the second resistors 121 and 123. Therefore, if a resistance value between the gate of the load FET2 and the $V_{SS}$ power source terminal is designated as $R_{2t}$, $R_{2t}$ in this case designates a composite resistance of the second resistors 121 and 123 connected in parallel, and the gate-source voltage $V_{gs}$ of the load FET2 becomes

22

$$V_{gs}=R_1(V_{SS}-V_{OUT})/(R_1+R_{2t}) (\leq 0).$$

Here, the voltage $V_{DS}$ of the current control FET in the on-state is made significantly smaller than the voltage drop due to the first and the second resistors. If all current control FETs take the off-state, $R_{2t}=\infty$ and, consequently, $V_{gs}=0$. Therefore, by changing the combination of the current control FETs in the on-state, this $R_{2t}$ can be changed and, consequently, the gate-source voltage $V_{gs}$ of the load FET can be changed. Since this makes it possible to adjust the dissipation current, the dissipation current of each logic gate circuit can easily be optimized. Furthermore, by using this logic gate circuit, the power dissipation of the LSI can be reduced.

The number of the parallel connections of the current control element, each comprising a second resistor and a current control FET connected in series, does not have to be three but can be arbitrary.

[Embodiment 11]

An eleventh embodiment of the present invention will be described.

Figure 12:
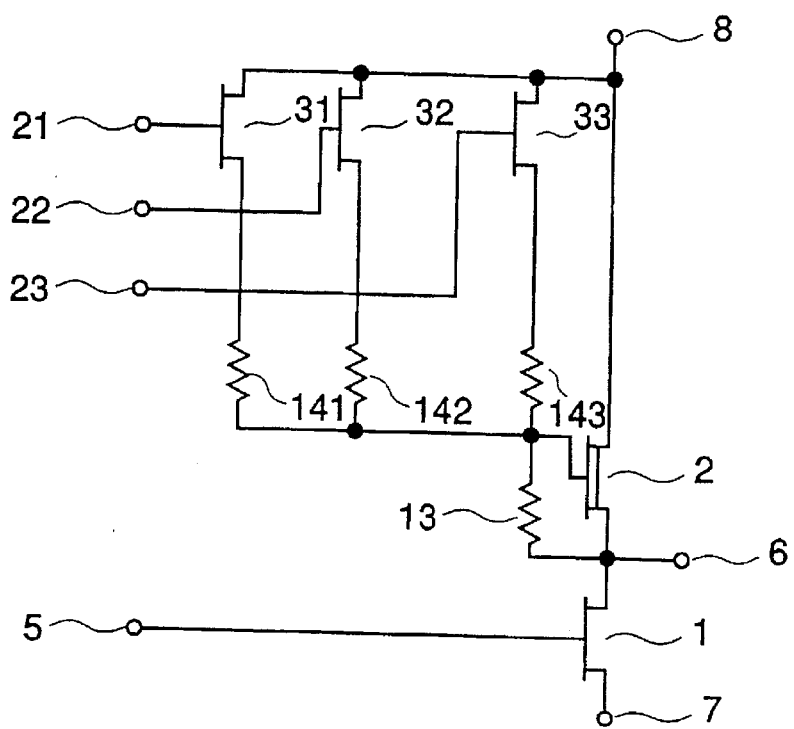
FIG. 12 is a circuit diagram illustrating a logic gate circuit according to an eleventh embodiment of the present invention.

FIG. 12 is a circuit diagram illustrating a logic gate circuit according to the eleventh embodiment of the present invention. In the figure, reference numerals 21, 22, and 23 designate current control signal input terminals, and reference numerals 31, 32, and 33 designate current control FETs. This logic gate circuit is the same as the sixth embodiment except that it includes three current control elements connected in parallel, each of which comprises a second resistor and a current control FET connected in series.

In the logic gate circuit of the eleventh embodiment, if a resistance value between the gate of the load FET2 and the $V_{DD}$ power source terminal is designated as $R_{2t}$, $R_{2t}$ designates a composite resistance of the second resistors which are connected to the current control FETs in the on-state as in the tenth embodiment, and the voltage $V_{gs}$ between the gate and the source of the load FET2 becomes $$V_{gs}=R_1(V_{DD}-V_{OUT})/(R_1+R_{2t}) (\geq 0).$$

Here, the voltage $V_{DS}$ of the current control FET in the on-state is significantly smaller than the voltage drop due to the first and the second resistors. If all current control FETs are in the off-state, $R_{2t}=\infty$ and, consequently, $V_{gs}=0$. Therefore, by changing the combination of the current control FETs in the on-state, this $R_{2t}$ can be changed and, consequently, the voltage of the load FET can be changed. Since this makes it possible to adjust the dissipation current, the dissipation current of each logic gate circuit can easily be optimized. Furthermore, by using this logic gate circuit, the power dissipation of the LSI can be reduced.

The number of the parallel connections of the current control elements, each comprising a second resistor and a current control FETs connected in series, does not have to be three but can be arbitrary.

[Embodiment 12]

A twelfth embodiment of the present invention will be described.

Figure 13:
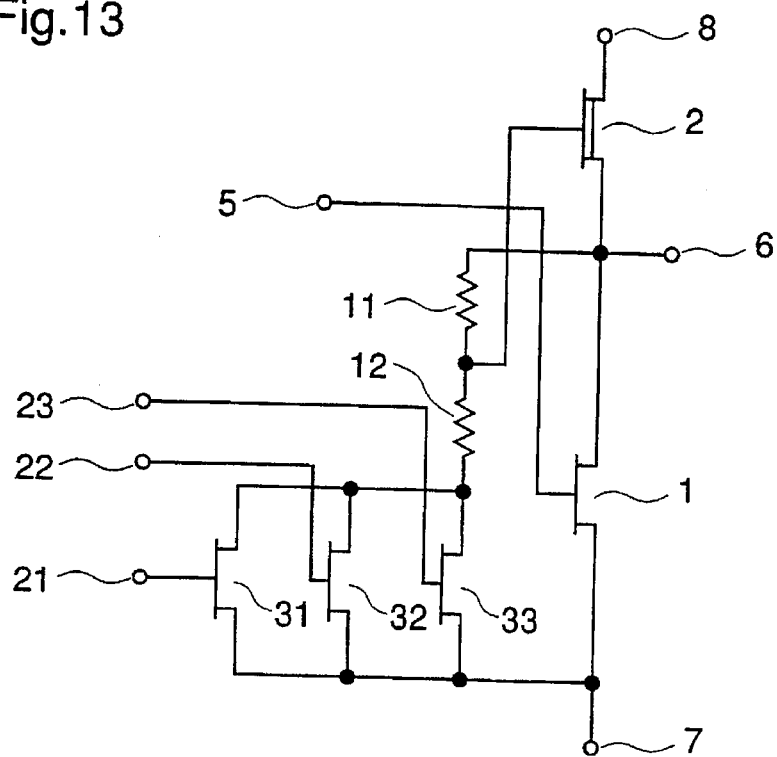
FIG. 13 is a circuit diagram illustrating a logic gate circuit according to a twelfth embodiment of the present invention.

FIG. 13 is a circuit diagram illustrating a logic gate circuit according to the twelfth embodiment of the present invention. This logic gate circuit is the same as the fourth embodiment except that it includes three current control FETs31, 32, and 33 connected in parallel. Here, in connecting the current control FET31, FET32, and FET33, the sources and the drains of each FET are connected and the gates serve as the independent current control signal input terminals 21, 22, and 23.

In the logic gate circuit of the twelfth embodiment of the present invention, if at least one of the current control FETs takes the on-state, the second resistor 12 becomes connected to the $V_{SS}$ power source terminal 7 and the voltage $V_{gs}$ of the load FET2 becomes $$V_{gs}=R_1(V_{SS}-V_{OUT})/(R_1+R_2) \ (<0).$$

Here, the voltage $V_{DS}$ between the drain and the source of the current control FET is made significantly smaller than the voltage drop due to the first and the second resistors. On the other hand, if all current control FETs take the off-state, then $V_{gs}=0$. That is, this logic gate circuit is the same as the fourth embodiment except that an OR function for three current control signals has been added.

The number of the current control FETs connected in parallel does not have to be three but can be arbitrary.

Furthermore, in the logic gate circuit previously described in the tenth embodiment, each current control FET can be replaced with the multiple current control FETs connected in parallel as in the twelfth embodiment.

[Embodiment 13]

A thirteenth embodiment of the present invention will be described.

Figure 14:
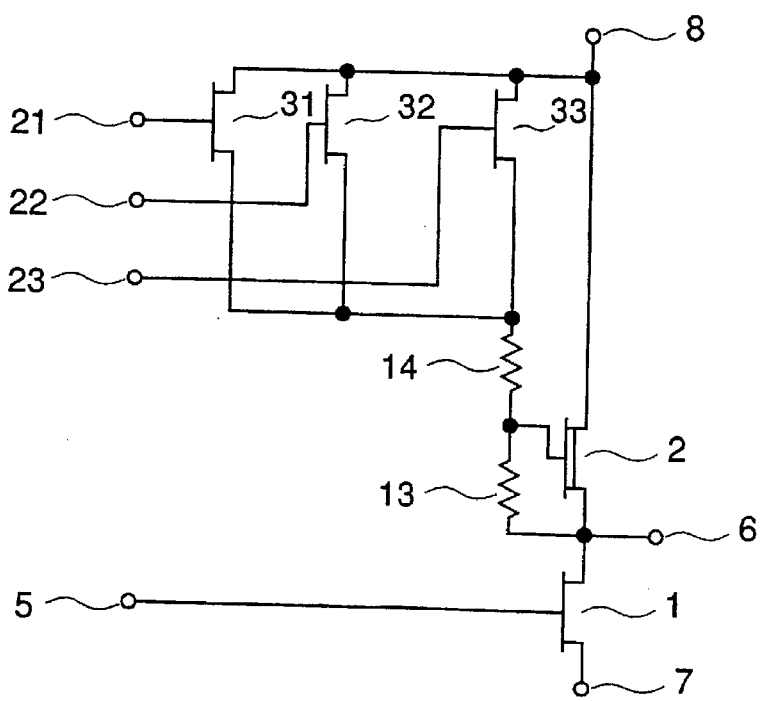
FIG. 14 is a circuit diagram illustrating a logic gate circuit according to a thirteenth embodiment of the present invention.

FIG. 14 is a circuit diagram illustrating a logic gate circuit according to the thirteenth embodiment of the present invention. This logic gate circuit is the same as the sixth embodiment except that the current control FET comprises three current control FETs31, 32, and 33 connected in parallel. Here, in the current control FET31, FET32, and FET33, the gates serve as the independent current control signal input terminals 21, 22, and 23.

In the logic gate circuit of the thirteenth embodiment of the present invention, if at least one of the current control FETs takes the on-state, the second resistor becomes connected to the $V_{DD}$ power source terminal 8 and the voltage $V_{gs}$ of the load FET2 becomes $$V_{gs}=R_1(V_{DD}-V_{OUT})/(R_1+R_2) \ (<0).$$

Here, the voltage $V_{DS}$ between the drain and the source of the current control FET is made significantly smaller than the voltage drop due to the first and the second resistors. On the other hand, if all current control FETs take the off-state, the voltage $V_{gs}$ becomes $V_{gs}=0$. That is, this logic gate circuit is the same as the sixth embodiment except that an OR function for three current control signals has been added.

The number of the current control FETs connected in parallel does not have to be three but can be arbitrary.

Furthermore, each current control FET in the logic gate circuit previously described in the eleventh embodiment can be replaced with the multiple current control FETs connected in parallel in the thirteenth embodiment.

[Embodiment 14]

A fourteenth embodiment of the present invention will be described.

Figure 15:
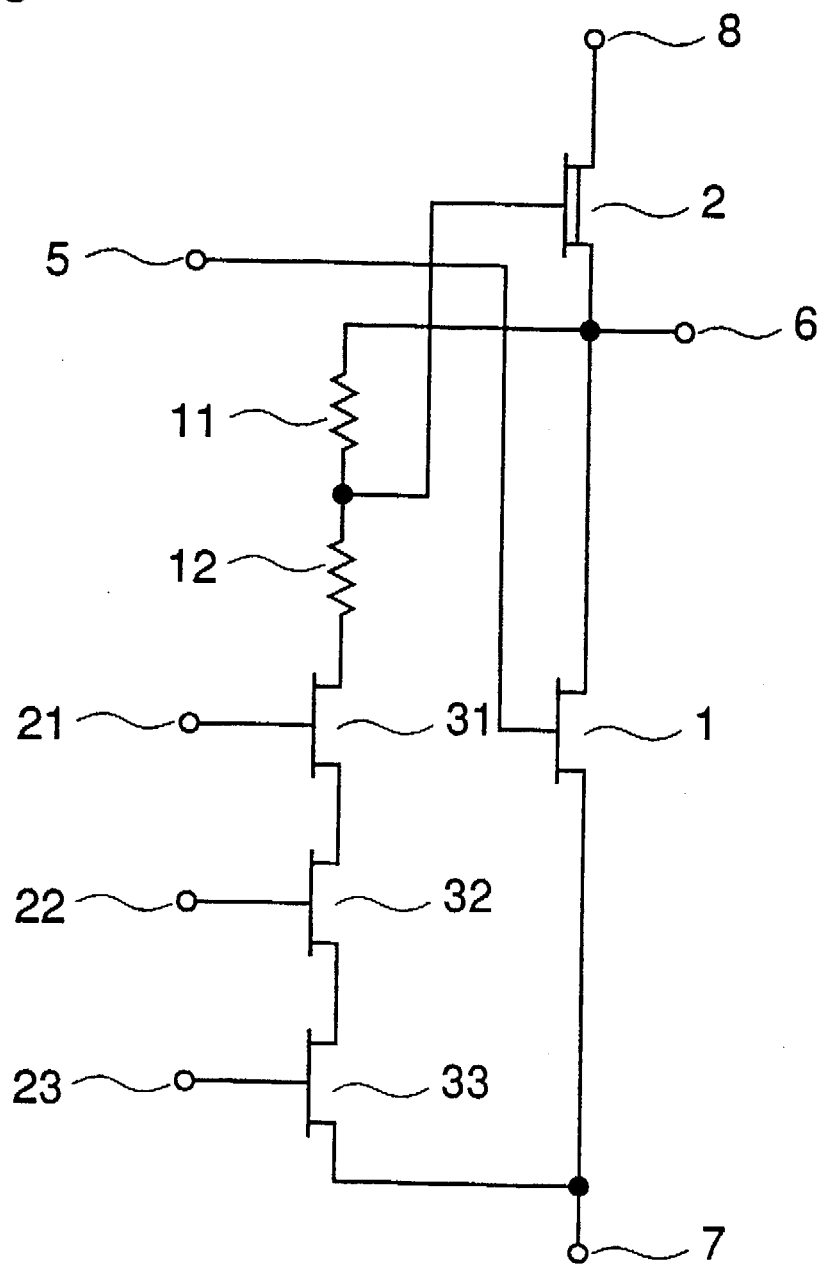
FIG. 15 is a circuit diagram illustrating a logic gate circuit according to a fourteenth embodiment of the present invention.

FIG. 15 is a circuit diagram illustrating a logic gate circuit according to the fourteenth embodiment of the present invention. This logic gate circuit is the same as the fourth embodiment except that the current control FET comprises three current control FETs31, 32, and 33 connected in series. Here, in the current control FET31, FET32, and FET33, the sources and the drains of each FET are connected and the gates serve as the independent current control signal input terminals 21, 22, and 23.

In the logic gate circuit of the fourteenth embodiment, only if all current control FETs take the on-state, the second resistor 12 becomes connected to the $V_{SS}$ power source terminal 7, and the voltage $V_{gs}$ of the load FET2 becomes $$V_{gs}=R_1(V_{SS}-V_{OUT})/(R_1+R_2) \ (<0).$$

Here, the sum of the voltages $V_{DS}$ between the drain and the source of the current control FETs is made significantly smaller than the voltage drop due to the first and the second resistors. On the other hand, if at least one of the current control FETs takes the off-state, the voltage $V_{gs}$ becomes $V_{gs}=0$. That is, this logic gate circuit is the same as the fourth embodiment except that an AND function for three current control signals has been added.

The number of the current control FETs connected in series does not have to be three but can be arbitrary.

Furthermore, each current control FET in the logic gate circuit previously described in the tenth embodiment can be replaced with the multiple current control FETs connected in series as in the fourteenth embodiment.

[Embodiment 15]

A fifteenth embodiment of the present invention will be described.

Figure 16:
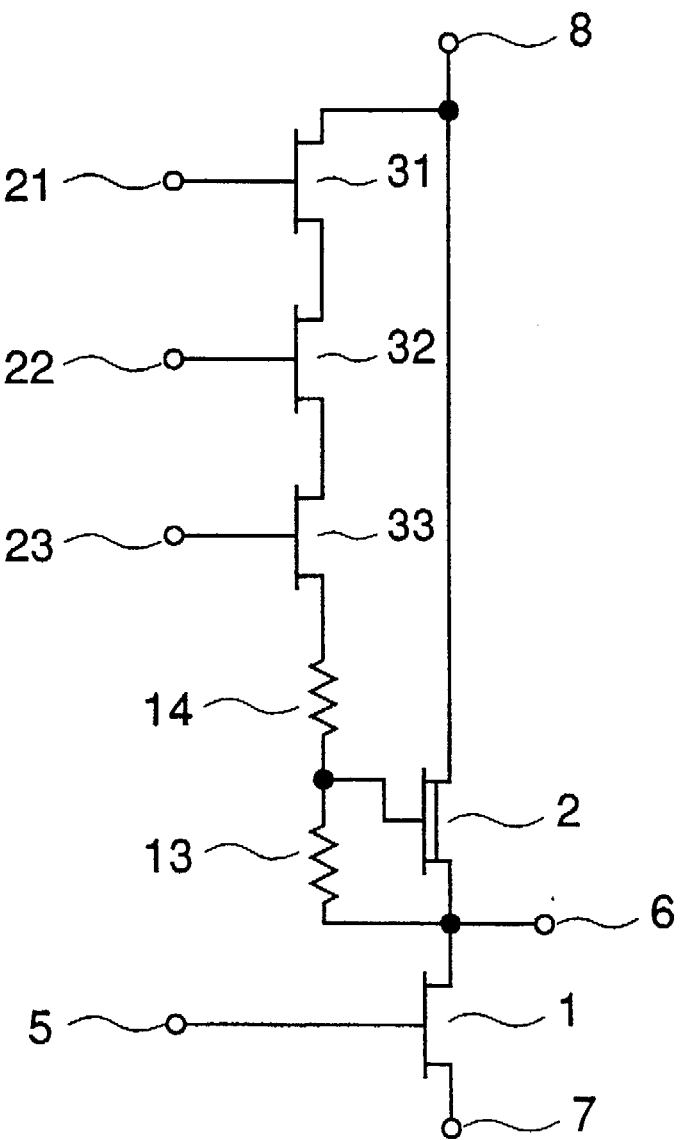
FIG. 16 is a circuit diagram illustrating a logic gate circuit according to a fifteenth embodiment of the present invention.

FIG. 16 is a circuit diagram illustrating a logic gate circuit according to the fifteenth embodiment of the present invention. This logic gate circuit is the same as the sixth embodiment except that the current control FET comprises three current control FETs31, 32, and 33 connected in series. Here, in connecting the current control FET31, FET32, and FET33, the gates serve as the independent current control signal input terminals 21, 22, and 23.

In the logic gate circuit of the fifteenth embodiment, only if all current control FETs take the on-state, the second resistor 14 becomes connected to the $V_{DD}$ power source terminal 8 and the voltage $V_{gs}$ of the load FET2 becomes $$V_{gs}=R_1(V_{DD}-V_{OUT})/(R_1+R_2) \ (>0).$$

Here, the sum of the voltages $V_{DS}$ between the drain and the source of the current control FETs is made significantly smaller than the voltage drop due to the first resistor 13 and the second resistor 14. On the other hand, if at least one of the current control FETs takes the off-state, the voltage $V_{gs}$ becomes $V_{gs}=0$. That is, this logic gate circuit is the same as the sixth embodiment except that an AND function for three current control signals has been added.

The number of the current control FETs connected in series does not have to be three but can be arbitrary.

Furthermore, each current control FET in the logic gate circuit previously described for the eleventh embodiment can be replaced with the multiple current control FETs connected in series as in the fifteenth embodiment.

[Embodiment 16]

A sixteenth embodiment of the present invention will be described.

Figure 17:
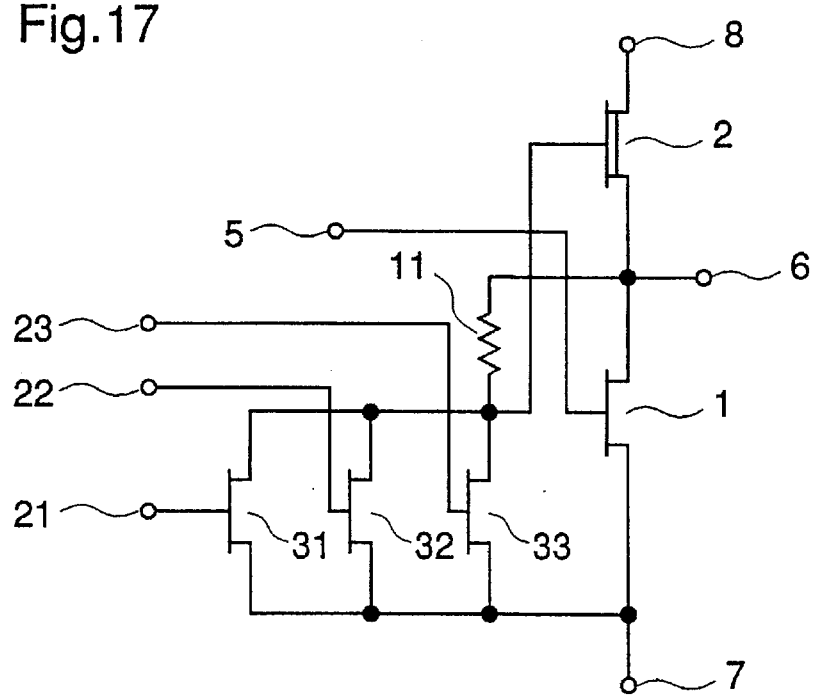
FIG. 17 is a circuit diagram illustrating a logic gate circuit according to a sixteenth embodiment of the present invention.

FIG. 17 is a circuit diagram illustrating a logic gate circuit according to the sixteenth embodiment of the present invention. This logic gate circuit is the same as the fifth embodiment except that the current control FET comprises three current control FETs31, 32, and 33 connected in parallel. Here, in the current control FET31, FET32, and FET33, the sources and the drains of each current control FET are connected and the gates serve as the independent current control signal input terminals 21, 22, and 23.

In the logic gate circuit of the sixteenth embodiment, if at least one of the current control FETs takes the on-state, the gate of the load FET2 becomes connected to the $V_{SS}$ power source terminal 7 and the voltage $V_{gs}$ of the load FET2 becomes $$V_{gs}=V_{SS}-V_{OUT} \ (<0).$$

Here, the voltage $V_{DS}$ between the drain and the source of the current control FET in this case is made sufficiently smaller than the voltage drop due to the first resistor. On the other hand, if all current control FETs take the off-state, the voltage $V_{gs}$ becomes $V_{gs}$=0. That is, this logic gate circuit is the same as the fifth embodiment except that an OR function for three current control signals has been added.

[Embodiment 17]

A seventeenth embodiment of the present invention will be described.

Figure 18:
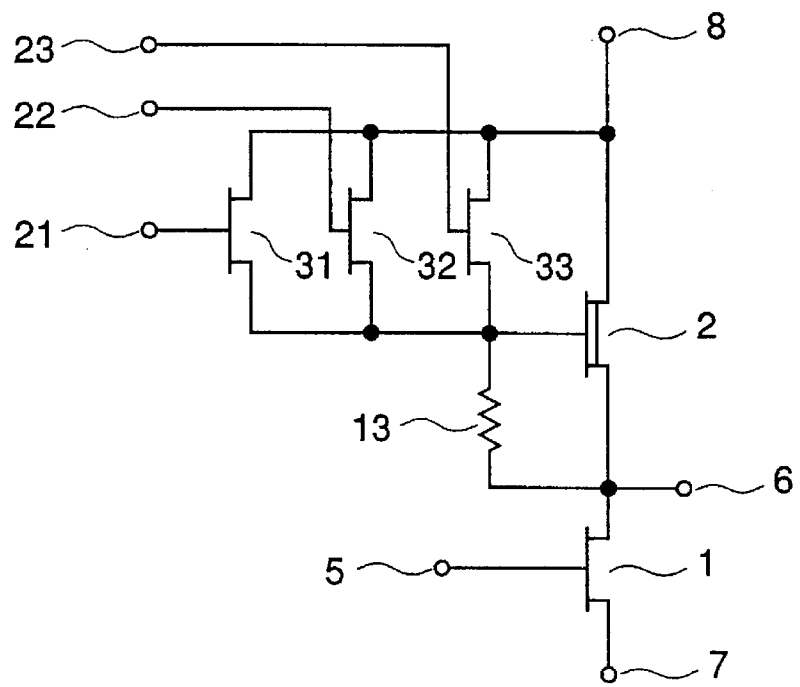
FIG. 18 is a circuit diagram illustrating a logic gate circuit according to a seventeenth embodiment of the present invention.

FIG. 18 is a circuit diagram illustrating a logic gate circuit according to the seventeenth embodiment of the present invention. This logic gate circuit is the same as the seventh embodiment except that the current control FET comprises three current control FETs 31, 32, and 33 connected in parallel. Here, in the current control FET31, FET32, and FET33, the gates serve as the independent current control signal input terminals 21, 22, and 23.

In the logic gate circuit of the seventeenth embodiment, if at least one of the current control FETs takes the on-state, the gate of the load FET2 becomes connected to the $V_{DD}$ power source terminal 8 and the voltage $V_{gs}$ of the load FET2 becomes $$i\ V_{gs}=V_{DD}-V_{OUT}\ (>0).$$

Here, the voltage $V_{DS}$ between the drain and the source of the current control FET in this case is made significantly smaller than the voltage drop due to the first resistor 13. On the other hand, if all current control FETs take the off-state, the voltage $V_{gs}$ becomes $V_{gs}$=0. That is, this logic gate circuit is the same as the seventh embodiment except that an OR function for three current control signals has been added.

[Embodiment 18]

An eighteenth embodiment of the present invention will be described.

Figure 19:
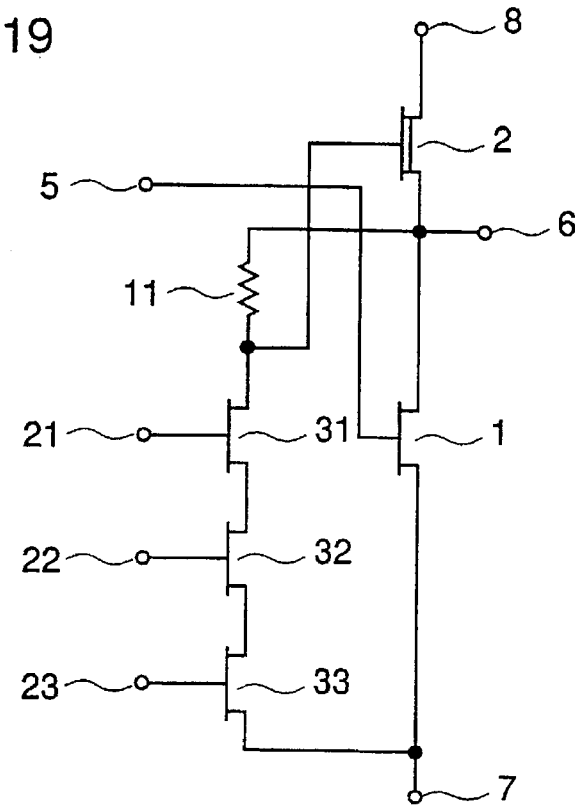
FIG. 19 is a circuit diagram illustrating a logic gate circuit according to an eighteenth embodiment of the present invention.

FIG. 19 is a circuit diagram illustrating a logic gate circuit according to the eighteenth embodiment of the present invention. This logic gate circuit is the same as the fifth embodiment except that the current control FET comprises three current control FETs31, 32, and 33 connected in series. Here, in the current control FET31, FET32, and FET33, the sources and the drains of each current control FET are connected and the gates serve as the independent current control signal input terminals 21, 22, and 23.

In the logic gate circuit of the eighteenth embodiment, only if all the current control FETs take the on-state, the gate of the load FET2 becomes connected to the $V_{SS}$ power source terminal 7 and the voltage $V_{gs}$ of the load FET2 becomes $$V_{gs}=V_{SS}-V_{OUT}\ (<0).$$

Here, the sum of the voltages $V_{DS}$ between the drain and the source of the current control FETs in this case is made significantly smaller than the voltage drop due to the first resistor 11. On the other hand, if at least one of the current control FETs takes the off-state, the voltage $V_{gs}$ becomes $V_{gs}$=0. That is, this logic gate circuit is the same as the fifth embodiment except that an AND function for three current control signals has been added.

[Embodiment 19]

A nineteenth embodiment of the present invention will be described.

Figure 20:
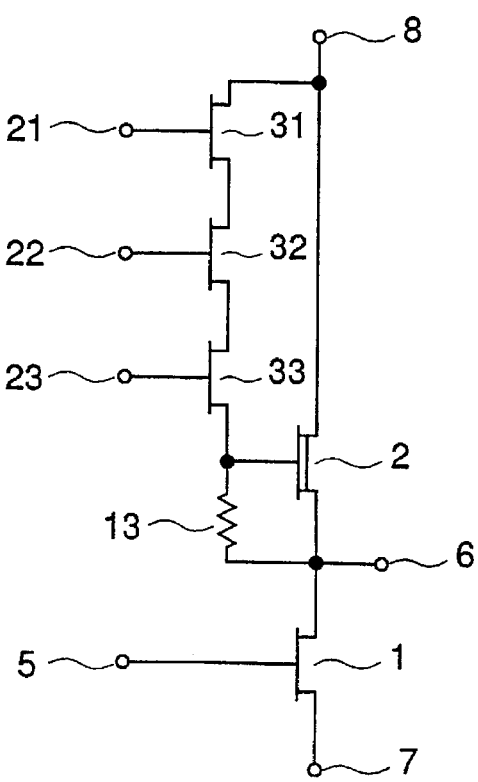
FIG. 20 is a circuit diagram illustrating a logic gate circuit according to a nineteenth embodiment of the present invention.

FIG. 20 is a circuit diagram illustrating a logic gate circuit according to the nineteenth embodiment of the present invention. This logic gate circuit is the same as the seventh embodiment except that the current control FET comprises three current control FETs31, 32, and 33 connected in series. Here, in the current control FET31, FET32, and FET33, the gates serve as the independent current control signal input terminals 21, 22, and 23.

In the logic gate circuit of the nineteenth embodiment illustrated in FIG. 20, only if all the current control FETs take the on-state, the gate of the load FET becomes connected to the $V_{DD}$ power source terminal 8 and the voltage $V_{gs}$ of the load FET2 becomes $$V_{gs}=V_{DD}-V_{OUT}\ (>0).$$

Here, the sum of the voltages $V_{DS}$ between the drain and the source of the current control FETs is made significantly smaller than the voltage drop due to the first resistor 13. On the other hand, if at least one of the current control FETs takes the off-state, the voltage $V_{gs}$ becomes $V_{gs}$=0. That is, this logic gate circuit is the same as the seventh embodiment except that an AND function for three current control signals has been added.

[Embodiment 20]

A twentieth embodiment of the present invention will be described.

Figure 21:
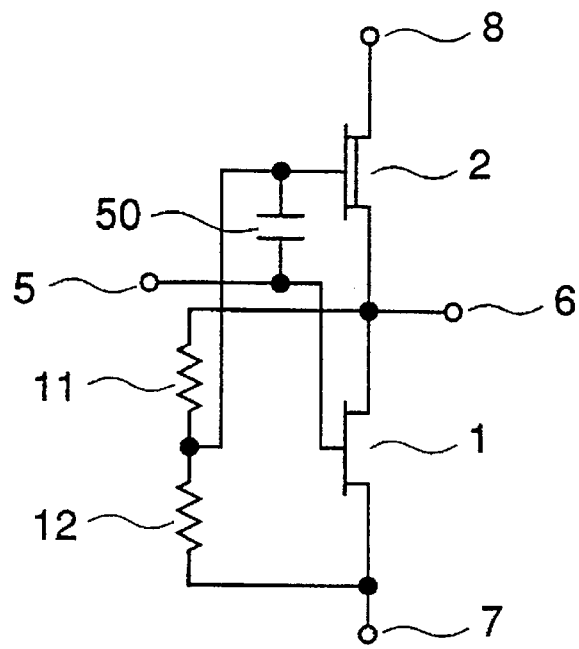
FIG. 21 is a circuit diagram illustrating a logic gate circuit according to a twentieth embodiment of the present invention.

FIG. 21 is a circuit diagram illustrating a logic gate circuit according to the twentieth embodiment of the present invention. In the figure, reference numeral 50 designates a capacitor. This logic gate circuit is the same in the first embodiment except that the capacitor 50 is further included connecting the gate of the switching FET1 and the gate of the load FET2.

Next, the operation of the logic gate circuit of the twentieth embodiment will be described.

In the logic gate circuit of the first embodiment previously described, when the signal voltage at the input terminal 5 changes from low to high, the switching FET1 changes its state from the off-state to the on-state. Current then flows from the gate of the next stage FET, which is connected to the output terminal 6, to the $V_{SS}$ power source terminal, which is connected to the source of the switching FET1, through the wiring and the switching FET1 in the on-state. The capacitance $C_{gs}$ between the gate and the source of the next stage FET and the wiring capacitance $C_L$ are discharged, and the signal voltage at the output terminal changes from high to low. The discharge current in this case is equal to the difference between the current which can flow through the on-state switching FET1 and the current which flows through the load FET2. The larger this discharge current is, the faster the discharging rate becomes, and in order to achieve a larger discharge current and a faster discharging rate, it is advantageous to make the current flowing through the load FET2 smaller. However, in the logic gate circuit in the first embodiment previously described, the voltage between the gate and the source of the load FET2 (the gate potential on the basis of the source potential) becomes $$V_{gs}=R_1(V_{SS}-V_{OUT})/(R_1+R_2) \qquad (1),$$

and $V_{gs}$<0 approaches zero as the signal voltage $V_{OUT}$ at the output terminal decreases from high ($V_H$) to low ($V_L$). As a result, the current flowing between the drain and the source of the load FET increases and, consequently, the discharge current described above decreases, whereby the discharging rate is reduced. On the other hand, in the logic gate circuit of the twentieth embodiment, since it is necessary to charge/discharge the capacitor 50 in order to change the gate voltage of the load FET2, the rate of change in the gate voltage of the load FET2 is reduced and, therefore, the time at which the current flowing through the load FET2 starts to increase can be delayed, whereby a reduction of the discharging rate is suppressed.

On the other hand, when the signal voltage at the input terminal changes from high to low, the switching FET changes its state from the on-state to the off-state, and the current then flows to the gate of the next stage FET through the load FET2 and the wiring, and the capacitance $C_{gs}$ between the gate and the source of the next stage FET and the wiring capacitance $C_L$ are charged, whereby the signal voltage at the output terminal changes from low to high. The charging current in this case is the current which flows through the load FET2. The larger this charging current is, the faster the charging rate becomes, and in order to have a larger charging current and a faster charging rate, it is advantageous to make the current flowing through the load FET2 larger. However, in the logic gate circuit of the first embodiment previously described, as can be seen from the above equation (1), the voltage $V_{gs}<0$ of the load FET increases in absolute value as the signal voltage $V_{OUT}$ at the output terminal 6 increases from $V_L$ to $V_H$. As a result, the current flowing between the drain and the source of the load FET decreases and, consequently, the charging current described above decreases, whereby the charging rate is reduced. On the contrary, in the logic gate circuit of the twentieth embodiment, the rate of change in the gate voltage of the load FET is reduced because of the capacitance of the capacitor 50 and, therefore, the time at which the current flowing through the load FET starts to decrease can be delayed, whereby the reduction of the charging rate can be suppressed.

As described above, in the logic gate circuit of the twentieth embodiment, the degradation of operating speed can be controlled by reducing the rate of change in the gate voltage $V_{gs}$ of the load FET2.

In the logic gate circuit illustrated in FIG. 4(a) of the third embodiment as well as in the logic gate circuits of the fourth, fifth, tenth, twelfth, fourteenth, sixteenth, and eighteenth embodiments, a capacitor can be installed between the gate of the switching FET and the gate of the load FET as in the twentieth embodiment, whereby the degradation of the operating speed can be suppressed.

[Embodiment 21]

A twenty-first embodiment of the present invention will be described.

Figure 22:
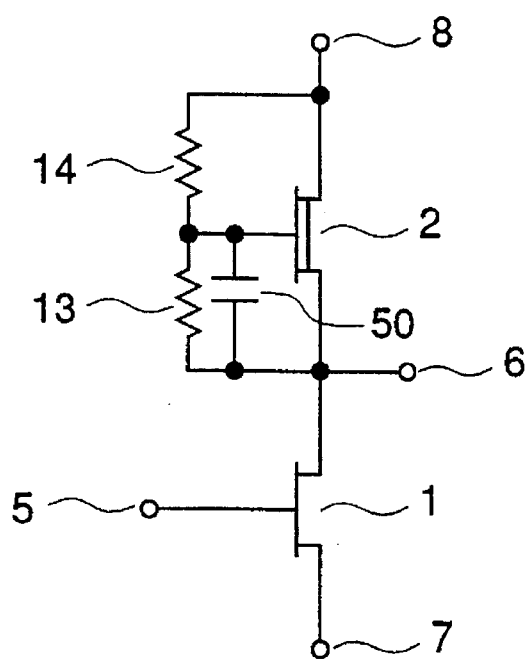
FIG. 22 is a circuit diagram illustrating a logic gate circuit according to a twenty-first embodiment of the present invention.

FIG. 22 is a circuit diagram illustrating a logic gate circuit according to the twenty-first embodiment of the present invention. In the figure, reference numeral 50 designates a capacitor. This logic gate circuit is the same as the second embodiment except that the capacitor 50 is further included connecting the gate and the source of the load FET2.

The operation of the logic gate circuit of the twenty-first embodiment will be described.

In the logic gate circuit of the second embodiment previously described, when the signal voltage at the input terminal 5 changes from low to high, the switching FET1 changes its state from the off-state to the on-state. Current then flows from the gate of the next stage FET, which is connected to the output terminal 6, to the $V_{SS}$ power source terminal, which is connected to the source of the switching FET1 through the wiring and the switching FET1 in the on-state. Therefore, the capacitance $C_{gs}$ between the gate and the source of the next-stage FET and the wiring capacitance $C_L$ are discharged, and the signal voltage at the output terminal changes from high to low. The discharge current in this case is equal to the difference between the current which can flow through the on-state switching FET1 and the current which flows through the load FET2. The larger this discharge current is, the faster the discharging rate becomes, and in order to have a larger discharge current and a faster discharging rate, it is advantageous to make the current flowing through the load FET2 smaller. However, in the logic gate circuit in the second embodiment previously described, the voltage $V_{gs}$ of the load FET2 becomes $$V_{gs}=R_1(V_{DD}-V_{OUT})/(R_1+R_2) \quad (2),$$

and $V_{gs}>0$ increases as the signal voltage $V_{OUT}$ at the output terminal decreases from high ($V_H$) to low ($V_L$). As a result, the current flowing between the drain and the source of the load FET increases and, consequently, the discharge current described above decreases, whereby the discharging rate is reduced. On the contrary, in the logic gate circuit of the twenty-first embodiment, since it is necessary to charge the capacitor 50 in order to increase the voltage $V_{gs}$ of the load FET2, the rate of increase in the voltage of the load FET2 is reduced and, therefore, the time at which the current flowing through the load FET2 starts to increase can be delayed, whereby a reduction of the discharging rate can be suppressed.

On the other hand, when the signal voltage at the input terminal changes from high to low, the switching FET changes its state from the on-state to the off-state. Current then flows to the next stage FET through the load FET2 and the wiring, and the capacitance $C_{gs}$ between the gate and the source of the next stage FET and the wiring capacitance $C_L$ are charged, thereby changing the signal voltage at the output terminal changes from low to high. The charging current in this case is the current which flows the load FET2. The larger this charging current is, the faster the charging rate becomes, and in order to obtain a larger charging current and a faster charging rate, it is advantageous to make the current flowing through the load FET2 larger. However, in the logic gate circuit of the second embodiment previously described, as can be seen from the above equation (2), the voltage $V_{gs}>0$ of the load FET decreases as the signal voltage $V_{OUT}$ at the output terminal 6 increases from $V_L$ to $V_H$. As a result, the current flowing between the drain and the source of the load FET decreases and, consequently, the charging current described above decreases. Therefore, the charging rate is reduced. On the contrary, in the logic gate circuit of the twenty-first embodiment, since the capacitor 50 has to be discharged, the rate of decrease in the gate-source voltage $V_{gs}$ of the load FET is reduced and, therefore, the time at which the current flowing through the load FET starts to decrease can be delayed, whereby a reduction of the charging rate can be suppressed.

As described above, in the logic gate circuit of the twenty-first embodiment, the degradation of operating speed can be controlled by reducing the rate of change in the voltage $V_{gs}$ of the load FET2.

In the logic gate circuit illustrated in FIG. 4(b) of the third embodiment as well as in the logic gate circuits the sixth, seventh, eighth, ninth, eleventh, thirteenth, fifteenth, seventeenth, and nineteenth embodiments, a capacitor can be installed between the gate and the source of the load FET as in the twenty-first embodiment, whereby the degradation of the operating speed can be suppressed.

[Embodiment 22]

A twenty-second embodiment of the present invention will be described.

Figure 23:
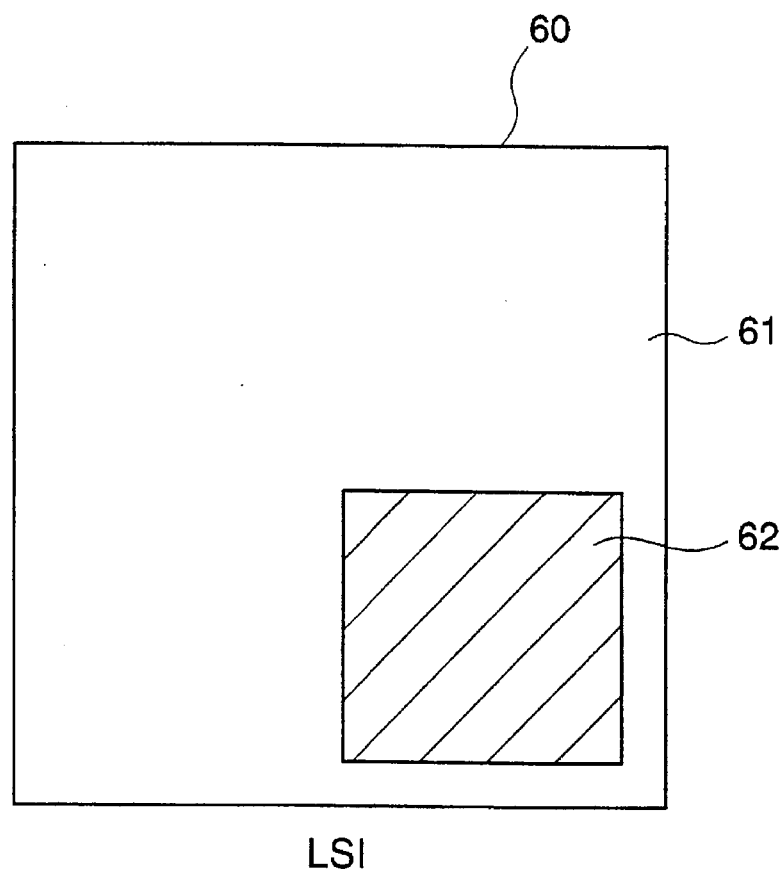
FIG. 23 is a drawing illustrating a digital LSI chip according to a twenty-second embodiment of the present invention.
Figure 24:
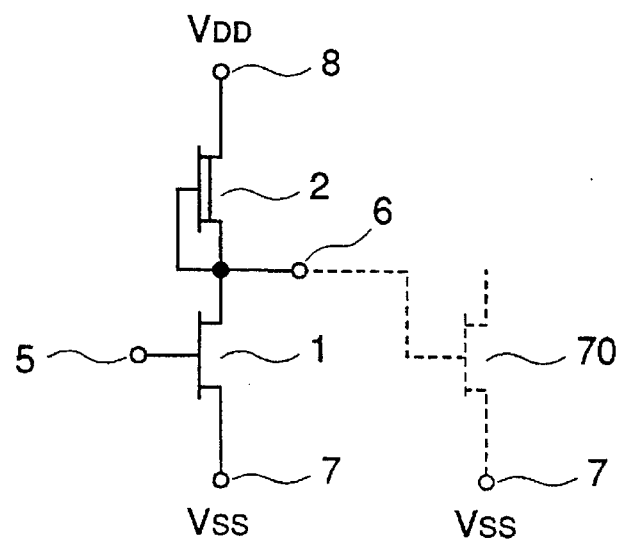
FIG. 24 is a circuit diagram illustrating a prior art DCFL inverter circuit.
Figure 25:
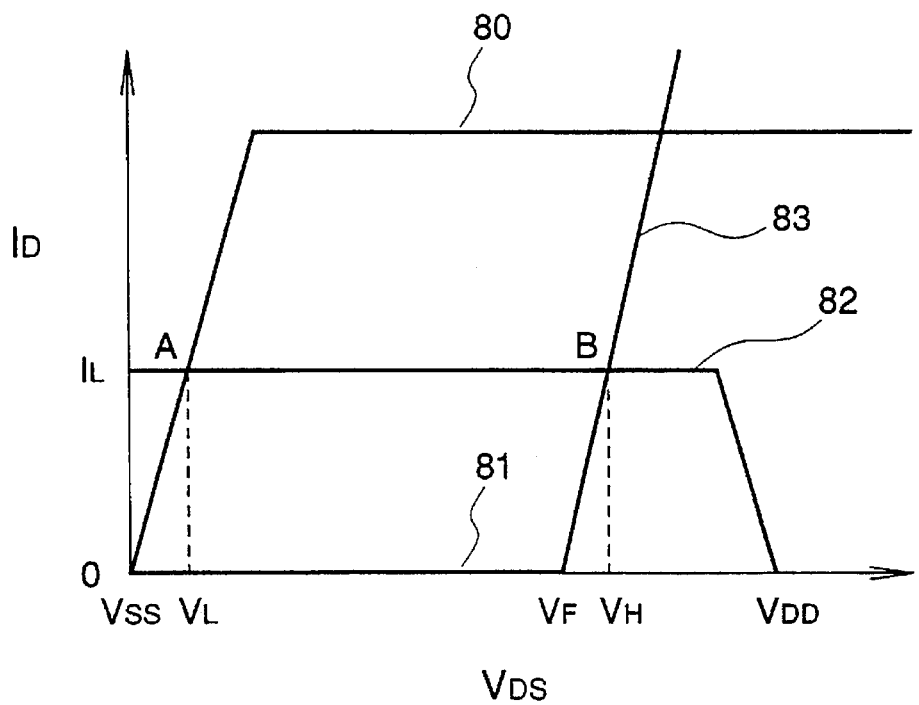
FIG. 25 is a diagram describing the operation of the prior art DCFL inverter circuit.
Figure 26:
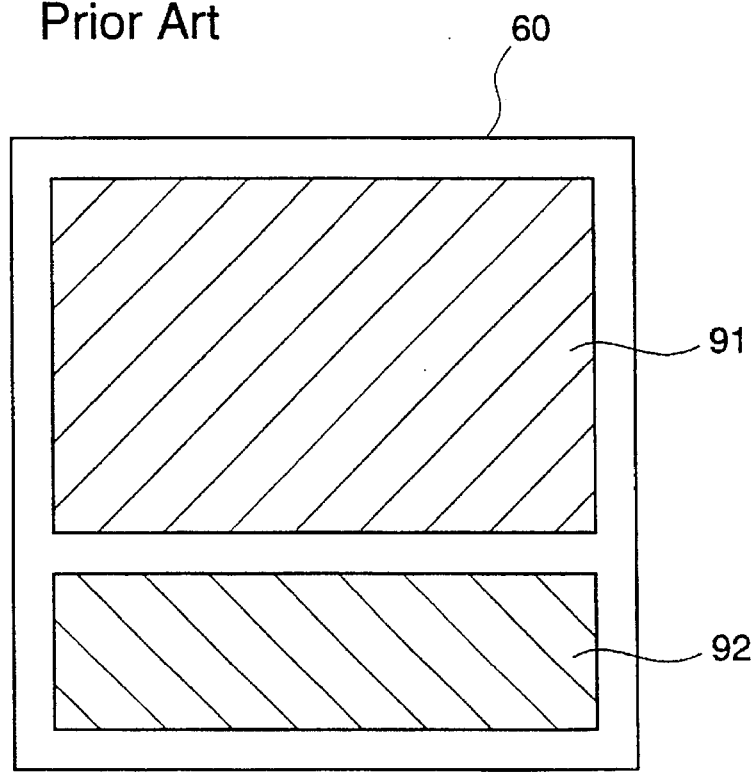
FIG. 26 is a drawing illustrating a prior art digital LSI chip.

FIG. 23 illustrates a digital LSI according to the twenty-second embodiment of the present embodiment. In the figure, reference numeral 60 designates an LSI chip, reference numeral 61 designates a gate array, and reference numeral 62 designates an specific region (RAM or the like). The digital LSI of the twenty-second embodiment is an embedded cell array utilizing the logic gate circuits of embodiments 1–21. An embedded cell array is an LSI in which a specific region such as RAM is disposed on apart of the gate array.

In the twenty-second embodiment of the present invention, by using the logic gate circuit of embodiments 1–21 in the embedded cell array, a digital LSI having a small, chip area whose power dissipation is small even if the threshold voltages of the load FETs are chosen to be the same, can be realized.

What is claimed is:

1. A logic gate circuit comprising:
   an input terminal and an output terminal;
   a first resistor;
   a current limiting circuit having first and second ends;
   a switching transistor having a drain, a source, and a gate; and
   a load transistor which is a depletion type field effect transistor having a source and a gate,
   the source of the load transistor being connected to the drain of the switching transistor,
   the gate of the switching transistor being connected to the input terminal,
   the drain of the switching transistor being connected to the output terminal,
   the first resistor being connected between the source of the load transistor and the gate of the load transistor, and
   the first end of the current limiting circuit being connected to the gate of the load transistor and the second end of the current limiting circuit being connected to the source of the switching transistor.

2. The logic gate circuit of claim 1 wherein the current limiting circuit comprises a second resistor having first and second ends, the first end of the second resistor being the first end of the current limiting circuit and the second end of the second resistor being the second end of the current limiting circuit.

3. The logic gate circuit of claim 1 wherein the current limiting circuit comprises a current control element comprising a current control signal input terminal, a second resistor having a first end comorising the first end of the current limiting circuit, and a current control transistor having a source, a drain, and a gate, the source of the current control transistor being the second end of the current limiting circuit, the drain of the current control transistor being connected to a second end of the second resistor, and the gate of the current control transistor being connected to the current control signal input terminal.

4. The logic gate circuit of claim 1 wherein the current limiting circuit comprises a plurality of current control elements connected in parallel, each current control element comprising a current control signal input terminal, a second resistor having first and second ends, the first end of the second resistor being connected to the first end of the current limiting circuit, and a current control transistor having a source, a drain, and a gate, the source of the current control transistor being connected to the second end of the current limiting circuit, the drain of the current control transistor being connected to the second end of the second resistor, and the gate of the current control transistor being connected to the current control signal input terminal.

5. The logic gate circuit of claim 3 wherein each current control element comprises a plurality of current control signal input terminals, a second resistor having first and second ends, the first end of the second resistor being connected to the first end of the current limiting circuit, and the same number of current control transistors, connected in parallel, as current control input terminals, each current control transistor having a gate, a drain, and a source, the drain of each current control transistor being the second end of the second resistor, the gate of each current control transistor being one of the current control signal input terminals, and the source of each current control transistor being connected to the second end of the current limiting circuit.

6. The logic gate circuit of claim 4 wherein each current control element comprises a plurality of current control signal input terminals, a second resistor having first and second ends, the first end of the second resistor being connected to the first end of the current limiting circuit, and the same number of current control transistors, connected in parallel, as current control input terminals, each current control transistor having a gate, a drain, and a source, the drain of each current control transistor being the second end of the second resistor, the gate of each current control transistor being one of the current control signal input terminals, and the source of each current control transistor being connected to the second end of the current limiting circuit.

7. The logic gate circuit of claim 3 wherein each current control element comprises a plurality of current control signal input terminals, a second resistor having first and second ends, the first end of the second resistor being connected to the first end of the current limiting circuit, and the same number of current control transistors, connected in series, as current control input terminals, each current control transistor having a gate, a drain, and a source, the source of one of the current control transistors at a first end of the series being connected to the second end of the current limiting circuit, the drain of another of the current control transistors at a second end of the series being connected to the second end of the second resistor, and the gate of each current control transistor being one of the current control signal input terminals.

8. The logic gate circuit of claim 4 wherein each current control element comprises a plurality of current control signal input terminals, a second resistor having first and second ends, the first end of the second resistor being connected to the first end of the current limiting circuit, and the same number of current control transistors, connected in series, as current control input terminals, each current control transistor having a gate, a drain, and a source, the source of one of the current control transistors at a first end of the series being connected to the second end of the current limiting circuit, the drain of another of the current control transistors at a second end of the series being connected to the second end of the second resistor, and the gate of each current control transistor being one of the current control signal input terminals.

9. The logic gate circuit of claim 1 wherein the current limiting circuit comprises a current control signal input terminal and a current control transistor having a drain, a source, and a gate, the drain of the current control transistor being the first end of the current limiting circuit, the source of the current control transistor being the second end of the current limiting circuit, and the gate of the current control transistor being the current control signal input terminal.

10. The logic gate circuit of claim 1 wherein each current limiting circuit comprises a plurality of current control signal input terminals and the same number of current control transistors, connected in parallel, as the current control signal input terminals, each current control transistor having a drain, a source, and a gate, the drain of each current control transistor being connected to the first end of the current limiting circuit, the source of each current control transistor being connected to the second end of the current limiting circuit, and the gate of each current control transistor being one of the current control signal input terminals.

11. The logic gate circuit of claim 1 wherein each current limiting circuit comprises a plurality of current control signal input terminals and the same number of current control transistors, connected in series, as the current control signal input terminals, each current control transistor having a drain, a source, and a gate, the drain of one of the current control transistors at one end of the series being a first end of the current limiting circuit, the source of another of the current control transistors at a second end of the series being the second end of the current limiting circuit, and the gate of each current control transistor being one of the current control signal input terminals.

12. The logic gate circuit of claim 1 further comprising a capacitor connected to the gate of the switching transistor and to the gate of the load transistor.

13. A logic gate circuit comprising:

an input terminal and an output terminal;

a first resistor;

a current limiting circuit having first and second ends;

a switching transistor having a drain and a gate; and a load transistor having a source, a gate, and a drain, the source of the load transistor being connected to the drain of the switching transistor, the gate of the switching transistor being connected to the input terminal, the drain of the switching transistor being connected to the output terminal, the first resistor being connected between the source of the load transistor and the gate of the load transistor, and the first end of the current limiting circuit being connected to the gate of the load transistor and the second end of the current limiting circuit being connected to the drain of the load transistor.

14. The logic gate circuit of claim 13 wherein the current limiting circuit comprises a second resistor having first and second ends, the first end of the second resistor being the first end of the current limiting circuit and the second end of the second resistor being the second end of the current limiting circuit.

15. The logic gate circuit of claim 13 wherein the current limiting circuit comprises a current control element comprising a current control signal input terminal, a second resistor having a first end comprising the first end of the current limiting circuit, and a current control transistor having a source, a drain, and a gate, the drain of the current control transistor being the second end of the current limiting circuit, the source of the current control transistor being connected to a second end of the second resistor, and the gate of the current control transistor being connected to the current control signal input terminal.

16. The logic gate circuit of claim 13 wherein the current limiting circuit comprises a plurality of current control elements connected in parallel, each current control element comprising a current control signal input terminal, a second resistor having first and second ends, the first end of the second resistor being connected to the first end of the current limiting circuit, and a current control transistor having a source, a drain, and a gate, the drain of the current control transistor being connected to the second end of the current limiting circuit, the source of the current control transistor being connected to the second end of the second resistor, and the gate of the current control transistor being connected to the current control signal input terminal.

17. The logic gate circuit of claim 15 wherein each current control element comprises a plurality of current control signal input terminals, a second resistor having first and second ends, the first end of the second resistor being connected to the first end of the current limiting circuit, and the same number of current control transistors, connected in parallel, as current control input terminals, each current control transistor having a gate, a drain, and a source, the source of each current control transistor being the second end of the second resistor, the gate of each current control transistor being one of the current control signal input terminals, and the drain of each current control transistor being connected to the second end of the current limiting circuit.

18. The logic gate circuit of claim 16 wherein each current control element comprises a plurality of current control signal input terminals, a second resistor having first and second ends, the first end of the second resistor being connected to the first end of the current limiting circuit, and the same number of current control transistors, connected in parallel, as current control input terminals, each current control transistor having a gate, a drain, and a source, the source of each current control transistor being the second end of the second resistor, the gate of each current control transistor being one of the current control signal input terminals, and the drain of each current control transistor being connected to the second end of the current limiting circuit.

19. The logic gate circuit of claim 15 wherein each current control element comprises a plurality of current control signal input terminals, a second resistor having first and second ends, the first end of the second resistor being connected to the first end of the current limiting circuit, and the same number of current control transistors, connected in series, as current control input terminals, each current control transistor having a gate, a drain, and a source, the drain of one of the current control transistors at a first end of the series being connected to the second end of the current limiting circuit, the source of another of the current control transistors at a second end of the series being connected to the second end of the second resistor, and the gate of each current control transistor being one of the current control signal input terminals.

20. The logic gate circuit of claim 16 wherein each current control element comprises a plurality of current control signal input terminals, a second resistor having first and second ends, the first end of the second resistor being connected to the first end of the current limiting circuit, and the same number of current control transistors, connected in series, as current control input terminals, each current control transistor having a gate, a drain, and a source, the drain of one of the current control transistors at a first end of the series being connected to the second end of the current limiting circuit, the source of another of the current control transistors at a second end of the series being connected to the second end of the second resistor, and the gate of each current control transistor being one of the current control signal input terminals.

21. The logic gate circuit of claim 13 wherein the current limiting circuit comprises a current control signal input terminal and a current control transistor having a drain, a source, and a gate, the source of the current control transistor being the first end of the current limiting circuit, the drain of the current control transistor being the second end of the current limiting circuit, and the gate of the current control transistor being the current control signal input terminal.

22. The logic gate circuit of claim 13 wherein each current limiting circuit comprises a plurality of current control signal input terminals and the same number of current control transistors, connected in parallel, as the current control signal input terminals, each current control transistor having a drain, a source, and a gate, the source of each current control transistor being connected to the first end of the current limiting circuit, the drain of each current control transistor being connected to the second end of the current limiting circuit, and the gate of each current control transistor being one of the current control signal input terminals.

23. The logic gate circuit of claim 13 wherein each current limiting circuit comprises a plurality of current control signal input terminals and the same number of current control transistors, connected in series, as the current control signal input terminals, each current control transistor having a drain, a source, and a gate, the source of one of the current control transistors at one end of the series being a first end of the current limiting circuit, the drain of another of the current control transistors at a second end of the series being the second end of the current limiting circuit, and the gate of each current control transistor being one of the current control signal input terminals.

24. The logic gate circuit of claim 13 further comprising a capacitor connected to the source of the load transistor and to the gate of the load transistor.

* * * * *